(12) United States Patent
Kim

(10) Patent No.: US 12,010,829 B2
(45) Date of Patent: Jun. 11, 2024

(54) MEMORY CELL AND SEMICONDUCTOR MEMORY DEVICE WITH THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 60 days.

(21) Appl. No.: 17/536,936

(22) Filed: Nov. 29, 2021

(65) Prior Publication Data

US 2022/0399341 A1 Dec. 15, 2022

(30) Foreign Application Priority Data

Jun. 10, 2021 (KR) ........................ 10-2021-0075592

(51) Int. Cl.
*H10B 12/00* (2023.01)
*G11C 5/06* (2006.01)
*H01L 27/06* (2006.01)

(52) U.S. Cl.
CPC .............. *H10B 12/30* (2023.02); *G11C 5/063* (2013.01); *H10B 12/03* (2023.02); *H10B 12/482* (2023.02); *H10B 12/485* (2023.02); *H10B 12/488* (2023.02); *H01L 27/0688* (2013.01)

(58) Field of Classification Search
CPC .............. G11C 5/063; H01L 21/32053; H01L 21/8221; H01L 21/823475; H01L 27/0688; H01L 28/86; H10B 12/00; H10B 12/03; H10B 12/0335; H10B 12/30; H10B 12/48; H10B 12/482; H10B 12/485; H10B 12/488
See application file for complete search history.

(56) References Cited

U.S. PATENT DOCUMENTS

| 2003/0102518 | A1* | 6/2003 | Fried | ........................ H01L 21/84 257/350 |
| 2006/0163631 | A1* | 7/2006 | Chen | .................. H10B 12/0383 257/296 |
| 2022/0102358 | A1* | 3/2022 | Park | ........................ H10B 12/33 |

* cited by examiner

*Primary Examiner* — Nicholas J Tobergte
*Assistant Examiner* — Kevin Quinto
(74) *Attorney, Agent, or Firm* — IP & T GROUP LLP

(57) ABSTRACT

A semiconductor memory device and method for making the same. The semiconductor device includes a transistor laterally extending in a direction parallel to a substrate and including an active layer over the substrate, the active layer having a first end and a second end; bit line contact nodes formed on an upper surface and a lower surface of the first end of the active layer, respectively; a bit line side-ohmic contact vertically extending and connecting to the first end of the active layer and the bit line contact nodes; a bit line extending in a vertical direction to the substrate and connected to the bit line side-ohmic contact; and a capacitor connected to the second end of the active layer.

29 Claims, 25 Drawing Sheets

MEMORY CELL AND SEMICONDUCTOR MEMORY DEVICE WITH THE SAME

CROSS-REFERENCE TO RELATED APPLICATIONS

The present application claims priority to Korean Patent Application No. 10-2021-0075592, filed on Jun. 10, 2021, which is incorporated herein by reference in its entirety.

BACKGROUND

1. Field

Various embodiments of the present invention relate to a semiconductor device and, more particularly, to a memory cell and a semiconductor device including a three-dimensional memory cell.

2. Description of the Related Art

Integration degree of two-dimensional semiconductor memory devices is mainly determined by the area occupied by memory cells. Thus, the integration degree is mainly affected by the level of a fine-pattern fabrication technology. The integration degree of two-dimensional semiconductor memory devices is still increasing, but the increase is limited because fabricating finer patterns requires highly expensive tools. Accordingly, three-dimensional (3D) semiconductor memory devices having three-dimensionally arranged memory cells are being suggested.

SUMMARY

Various embodiments of the present invention provide highly integrated memory cell(s) and semiconductor memory device(s) including the highly integrated memory cells.

A semiconductor memory device according to one embodiment of the present invention may comprise: a transistor laterally extending in a direction parallel to a substrate and including an active layer over the substrate, the active layer having a first end and a second end; bit line contact nodes formed on an upper surface and a lower surface of the first end of the active layer, respectively; a bit line side-ohmic contact vertically extending and connecting to the first end of the active layer and the bit line contact nodes; a bit line extending in a vertical direction to the substrate and connected to the bit line side-ohmic contact; and a capacitor connected to the second end of the active layer.

A semiconductor memory device according to another embodiment of the present invention may comprise: a transistor laterally extending in a direction parallel to a substrate and including an active layer over the substrate, the active layer having a first end and a second end; bit line contact nodes formed on an upper surface and a lower surface of the first end of the active layer, respectively; a bit line side-ohmic contact vertically extending and connecting to the first end of the active layer and the bit line contact nodes; a bit line extending in a vertical direction to the substrate and connected to the bit line side-ohmic contact; storage contact nodes formed on an upper surface and a lower surface of the second end of the active layer, respectively; a storage node side-ohmic contact vertically extending and connecting to the second end of the active layer and the storage contact nodes; and a capacitor connected to the storage node side-ohmic contact.

A method for fabricating a semiconductor memory device according to another embodiment of the present invention may comprise: forming a stack body laterally oriented and including an active layer, the active layer including a first end and a second end; forming first contact nodes on upper and lower surfaces of the first end of the active layer, respectively; forming a first ohmic contact being vertically oriented to cover the first contact nodes and the first end of the active layer; and forming a first conductive layer connected to the first ohmic contact and vertically oriented in a direction crossing the active layer. After the forming of the first conductive layer, the method may include: forming second contact nodes on upper and lower surfaces of the second end of the active layer, respectively; forming a second ohmic contact vertically oriented to cover the second contact nodes and the second end of the active layer; and forming a second conductive layer connected to the second ohmic contact. The first conductive layer may include a bit line and the second conductive layer may include a storage node of a capacitor. Before the forming of the first contact nodes, the method may further include forming conductive lines facing each other with the active layer interposed therebetween.

In one embodiment, the present invention may increase the height of the bit line side-ohmic contact by the bit line contact nodes. Accordingly, the contact area between the bit line and the bit line side-ohmic contact may be increased.

In one embodiment, the present invention may increase the height of the storage node side-ohmic contact by the storage contact nodes. Accordingly, the contact area between the storage node and the storage node side-ohmic contact may be increased.

In one embodiment, the present invention may improve the external resistance Rext in a three-dimensional dynamic random-access memory (DRAM).

DETAILED DESCRIPTION

Figure 1:
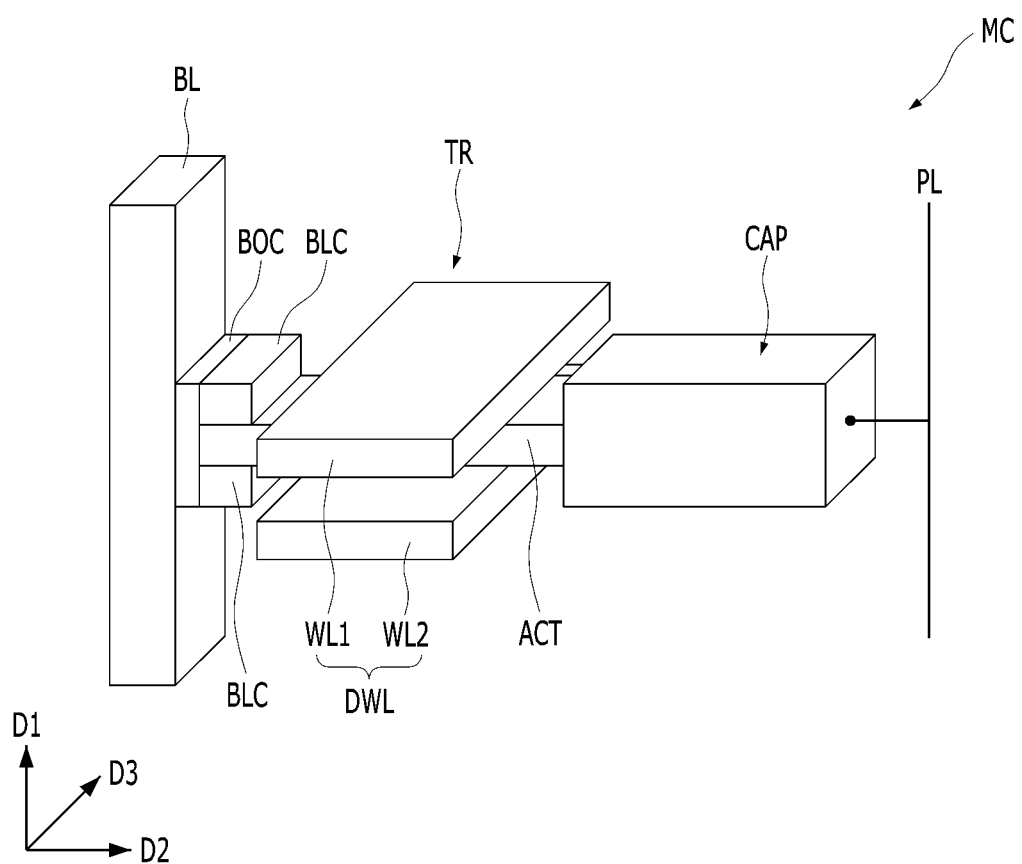
FIG. 1 is a schematic perspective view illustrating a memory cell of a semiconductor memory device according to one embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

In embodiments to be described below, memory cells are vertically stacked to increase memory cell density and reduce parasitic capacitance.

Figure 2:
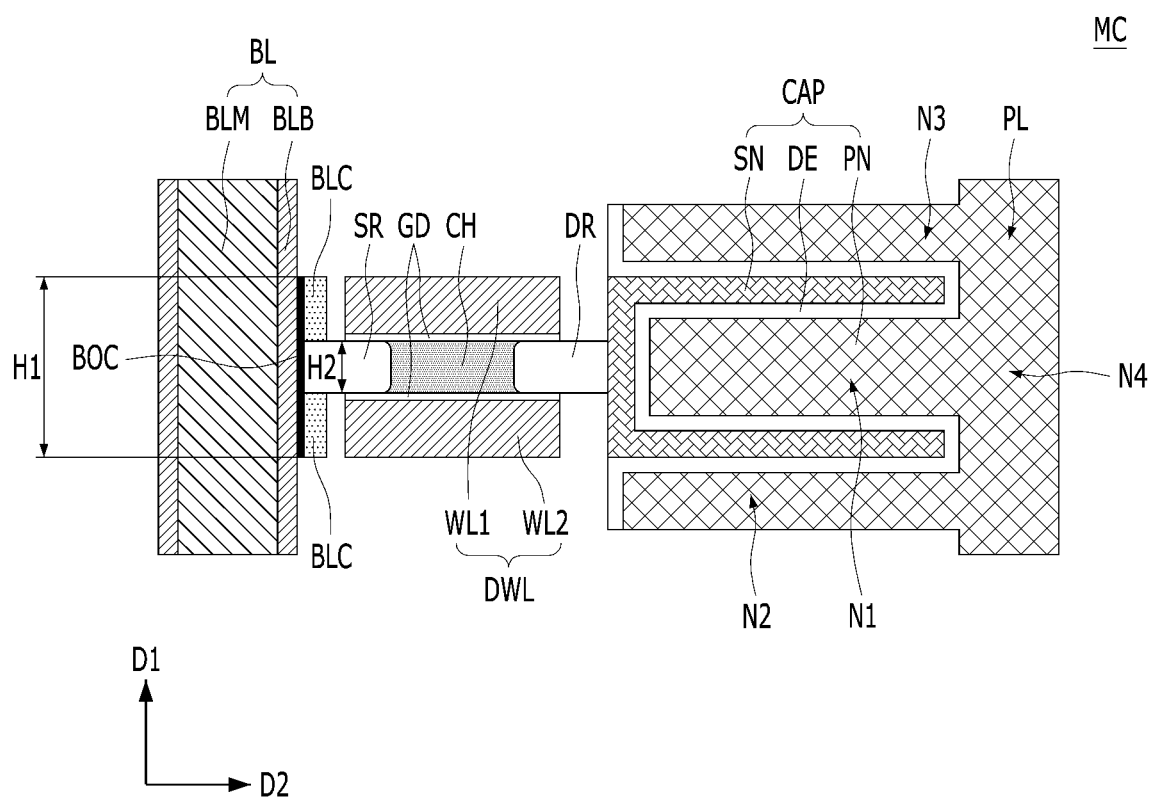
FIG. 2 is a cross-sectional view illustrating the memory cell of FIG. 1.

FIG. 1 is a schematic perspective view illustrating a memory cell of a semiconductor memory device according to one embodiment of the present invention. FIG. 2 is a cross-sectional view illustrating the memory cell of FIG. 1.

Referring to FIGS. 1 and 2, a memory cell MC of a 3D semiconductor memory device according to various embodiments of the present invention may include a bit line BL, a transistor TR, and a capacitor CAP. The transistor TR may include an active layer ACT and a double word line DWL (WL1, WL2). The double word line DWL may have the first and second word lines WL1 and WL2 facing each other with the active layer ACT interposed therebetween. The capacitor CAP may include a storage node SN, a dielectric layer DE, and a plate node PN.

The bit line BL may have a pillar shape extending in a first direction D1. The active layer ACT may have a bar shape extending in a second direction D2 which intersects the first direction D1. The double word line DWL may have a line shape extending in a third direction D3 intersecting both the first and second directions D1 and D2. The plate node PN of the capacitor CAP may be connected to the plate line PL.

The bit line BL may be vertically oriented along the first direction D1. The bit line BL may be referred to as a vertically oriented bit line or a pillar shape bit line. The bit line BL may include a conductive material. The bit line BL may include a silicon-based material, a metal-based material, or a combination thereof. The bit line BL may include for example silicon, metal, metal nitride, metal silicide, or a combination thereof. The bit line BL may also include, for example, polysilicon, titanium nitride, tungsten, or a combination thereof. For example, the bit line BL may include polysilicon or titanium nitride (TiN) doped with an N-type impurity. The bit line BL may include a TiN/W stack including titanium nitride and tungsten on the titanium nitride.

The bit line BL may include a bit line body BLM and a bit line barrier BLB. The bit line barrier BLB may be disposed on sides of the bit line body BLM. The bit line body BLM may include tungsten, and the bit line barrier BLB may include titanium nitride (TiN). In another embodiment, the bit line barrier BLB may surround sidewalls of the bit line body BLM.

The double word line DWL may extend along the third direction D3, and the active layer ACT may extend along the second direction D2. The active layer ACT may be laterally arranged along the second direction D2 from the bit line BL. The double word line DWL may include a pair of word lines, that is, the first word line WL1 and the second word line WL2. The first word line WL1 and the second word line WL2 may face each other along the first direction D1 with the active layer ACT interposed therebetween. A gate dielectric layer GD may be formed on the upper and lower surfaces of the active layer ACT.

The active layer ACT may include a semiconductor material or an oxide semiconductor material. For example, the active layer ACT may include silicon, germanium, silicon-germanium, or IGZO (indium gallium zinc oxide). The active layer ACT may include polysilicon or monocrystalline silicon. The active layer ACT may include a channel CH, a first source/drain region SR between the channel CH and the bit line BL, and a second source/drain region DR between the channel CH and the capacitor CAP. The channel CH may be defined between the first source/drain region SR and the second source/drain region DR.

The first source/drain region SR and the second source/drain region DR may be doped with an impurity of the same conductivity type. The first source/drain region SR and the second source/drain region DR may be doped with an N-type impurity or a P-type impurity. The first source/drain region SR and the second source/drain region DR may include at least one impurity selected from arsenic (As), phosphorus (P), boron (B), indium (In), and a combination thereof. A first side of the first source/drain region SR may be in contact with the bit line BL, and a second side of the first source/drain region SR may be in contact with the channel CH. A first side of the second source/drain region DR may be in contact with the storage node SN, and a second side of the second source/drain region DR may be in contact with the channel CH. A second side of the first source/drain region SR and a second side of the second source/drain region DR may partially overlap with sides of the first and second word lines WL1 and WL2. In one embodiment, a lateral length of the channel CH along the second direction D2 may be smaller than lateral lengths of the first and second source/drain regions SR and DR along the second direction D2. In another embodiment, the lateral length of the channel CH along the second direction D2 may be greater than the lateral lengths of the first and second source/drain regions SR and DR along the second direction D2.

In one embodiment, the transistor TR is a cell transistor and may have a double word line DWL. In the double word line DWL, the first word line WL1 and the second word line WL2 may have the same potential. For example, the first word line WL1 and the second word line WL2 may form a pair, and the same word line driving voltage may be applied to the first word line WL1 and the second word line WL2.

As described above, the memory cell MC according to one embodiment of the present invention may have a double word line DWL in which the first and second word lines WL1 and WL2 are adjacent to one channel CH.

In another embodiment, the first word line WL1 and the second word line WL2 may have different electric potentials. For example, a word line driving voltage may be applied to the first word line WL1, and a reference (e.g., ground) voltage may be applied to the second word line WL2. The second word line WL2 may be referred to as a back word line or a shield word line. In another embodiment, the reference (e.g., ground) voltage may be applied to the first word line WL1, and the word line driving voltage may be applied to the second word line WL2.

In one embodiment, the active layer ACT may be thinner than the first and second word lines WL1 and WL2. In other words, a vertical thickness of the active layer ACT along the first direction D1 may be smaller than a vertical thickness of each of the first and second word lines WL1 and WL2 along the first direction D1. As such, the thin active layer ACT may be referred to as a thin-body active layer. The thin active layer ACT may include a thin-body channel CH, and the thin-body channel CH may have a thickness of 10 nm or less. In another embodiment, the channel CH may have the same vertical thickness as the first and second word lines WL1 and WL2.

In one embodiment, an upper surface and a lower surface of the active layer ACT may have a flat surface. That is, an upper surface and a lower surface of the active layer ACT may be parallel to each other in the second direction D2.

The gate dielectric layer GD may be formed for example of silicon oxide, silicon nitride, metal oxide, metal oxynitride, metal silicate, high-k material, ferroelectric material, anti-ferroelectric material, or a combination thereof. The gate dielectric layer GD may include for example $SiO_2$, $Si_3N_4$, $HfO_2$, $Al_2O_3$, $ZrO_2$, AlON, HfON, HfSiO, HfSiON, or HfZrO.

The double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have low work function of 4.5 eV or less, and the P-type work function material may have high work function of 4.5 eV or more.

In one embodiment, a bit line side-ohmic contact BOC may be formed between the first source/drain region SR and the bit line BL. The bit line side-ohmic contact BOC and the first source/drain region SR may be commonly connected to bit line contact nodes BLC. The bit line contact nodes BLC may be connected to both an upper surface and a lower surface of the first source/drain region SR. The bit line contact nodes BLC may have a double structure that the bit line contact nodes are disposed on an upper surface and a lower surface of the first source/drain region SR, respectively. The bit line side-ohmic contact BOC may be disposed between the bit line contact nodes BLC and the bit line BL. A height H1 of the bit line side-ohmic contact BOC may be increased by the bit-line contact node BLC. A contact area between the bit line BL and the bit line side-ohmic contact BOC may be increased. A contact area between the bit line BL and the first source/drain region SR may also be increased.

The bit line contact nodes BLC may include polysilicon, for example, polysilicon doped with an N-type impurity. The height H1 of the bit line side-ohmic contact BOC, that is, the thickness H1 of the bit line side-ohmic contact BOC in the first direction D1, may be greater than a thickness H2 of the active layer ACT in the first direction D1. The first source/drain region SR may be doped with an N-type impurity diffused from the bit line contact node BLC. The bit line side-ohmic contact BOC may have a height fully covering side surfaces of the bit line contact nodes BLC and the first source/drain region SR. The bit line contact nodes BLC and the first source/drain region SR may form a 'horizontally oriented T-shaped structure', which may be formed by a combination of a variety of N-type doped polysilicon.

The bit line side-ohmic contact BOC may be formed when the silicon of the bit line contact node BLC and the first source/drain region SR react with the metal of the bit line BL. The bit line side-ohmic contact BOC may include metal silicide.

The capacitor CAP may be laterally disposed along the second direction D2 from the transistor TR. The capacitor CAP may include the storage node SN laterally extending from the active layer ACT in the second direction D2. The capacitor CAP may further include a dielectric layer DE and a plate node PN on the storage node SN. The storage node SN, the dielectric layer DE, and the plate node PN may be laterally arranged along the second direction D2. The storage node SN may have a laterally oriented cylindrical shape. The dielectric layer DE may conformally cover the cylindrical inner wall and the cylindrical outer wall of the storage node SN. The plate node PN may have a shape conforming to the dielectric layer DE on both the cylindrical inner wall and the cylindrical outer wall of the storage node SN. The plate node PN may be connected to the plate line PL. The storage node SN may be electrically connected to the second source/drain region DR.

The storage node SN may have a three-dimensional structure, and the storage node SN of the three-dimensional structure may have a three-dimensional structure laterally oriented along the second direction D2. As an example of the three-dimensional structure, the storage node SN may have a cylindrical shape. In another embodiment, the storage node SN may have a pillar shape or a pylinder shape. A pylinder shape refers to a structure in which a pillar shape and a cylinder shape are merged. Referring to the orientation shown in FIG. 2, the upper surface of the storage node SN may be positioned at the same level as the upper surface of the first word line WL1. The lowermost surface of the storage node SN may be positioned at the same level as the bottom surface of the second word line WL2.

The plate node PN may include an inner node N1 and outer nodes N2, N3, and N4. The inner node N1 and the outer nodes N2, N3, and N4 may be interconnected. The inner node N1 may be disposed inside the cylinder of the storage node SN. The outer nodes N2 and N3 may be disposed outside the cylinder of the storage node SN with the dielectric layer DE interposed therebetween. The outer node N4 may interconnect the inner node N1 and the outer nodes N2 and N3. The outer nodes N2 and N3 may be disposed to surround the outer cylindrical wall of the storage node SN. The external node N4 may serve as a plate line PL.

The storage node SN and the plate node PN may include metal, noble metal, metal nitride, conductive metal oxide, conductive noble metal oxide, metal carbide, metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), titanium nitride/tungsten (TiN/W) stack, and tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, the silicon germanium may be a gap-fill material filling inside the cylinder of the storage node SN over the titanium nitride, the titanium nitride (TiN) may serve as a plate node PN of a capacitor CAP, and the tungsten nitride may be a material having low resistivity.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. The high-k material may include for example hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a composite layer including two or more layers of the high-k materials mentioned above.

The dielectric layer DE may be formed of a zirconium (Zr)-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA and ZAZ stacks may be referred to as a zirconium oxide ($ZrO_2$)-based layer. In another embodiment, the dielectric layer DE may be formed of hafnium (Hf)-base oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA, ZAZ, HA, and HAH stacks including aluminum oxide ($Al_2O_3$), the $Al_2O_3$ typically would have a greater band gap energy (hereinafter abbreviated as bandgap) than the zirconium oxide ($ZrO_2$) and the hafnium oxide ($HfO_2$). Aluminum oxide ($Al_2O_3$) typically also would have a lower dielectric constant than zirconium oxide ($ZrO_2$) and hafnium oxide ($HfO_2$). Accordingly, the dielectric layer DE may include a stack of a high-k material and a high-bandgap material having a bandgap greater than that of the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high bandgap material may be thinner than the high-k material. In another embodiment, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack or a HAHAH ($HfO_2/Al_2O_3/HfO_2/Al_2O_3/HfO_2$) stack. In the above laminated structure, aluminum oxide ($Al_2O_3$) may be thinner than the zirconium oxide ($ZrO_2$) and the hafnium oxide ($HfO_2$).

In another embodiment, the dielectric layer DE may include a stack structure, a laminated structure, or an intermixing structure including zirconium oxide, hafnium oxide, and aluminum oxide.

In another embodiment, the dielectric layer DE may include a ferroelectric material or an anti-ferroelectric material.

In another embodiment, an interface control layer for improving leakage current may be formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with other data storage materials. For example, data storage materials may include a phase change material, a magnetic tunnel junction (MTJ), or a variable resistance material.

Figure 3:
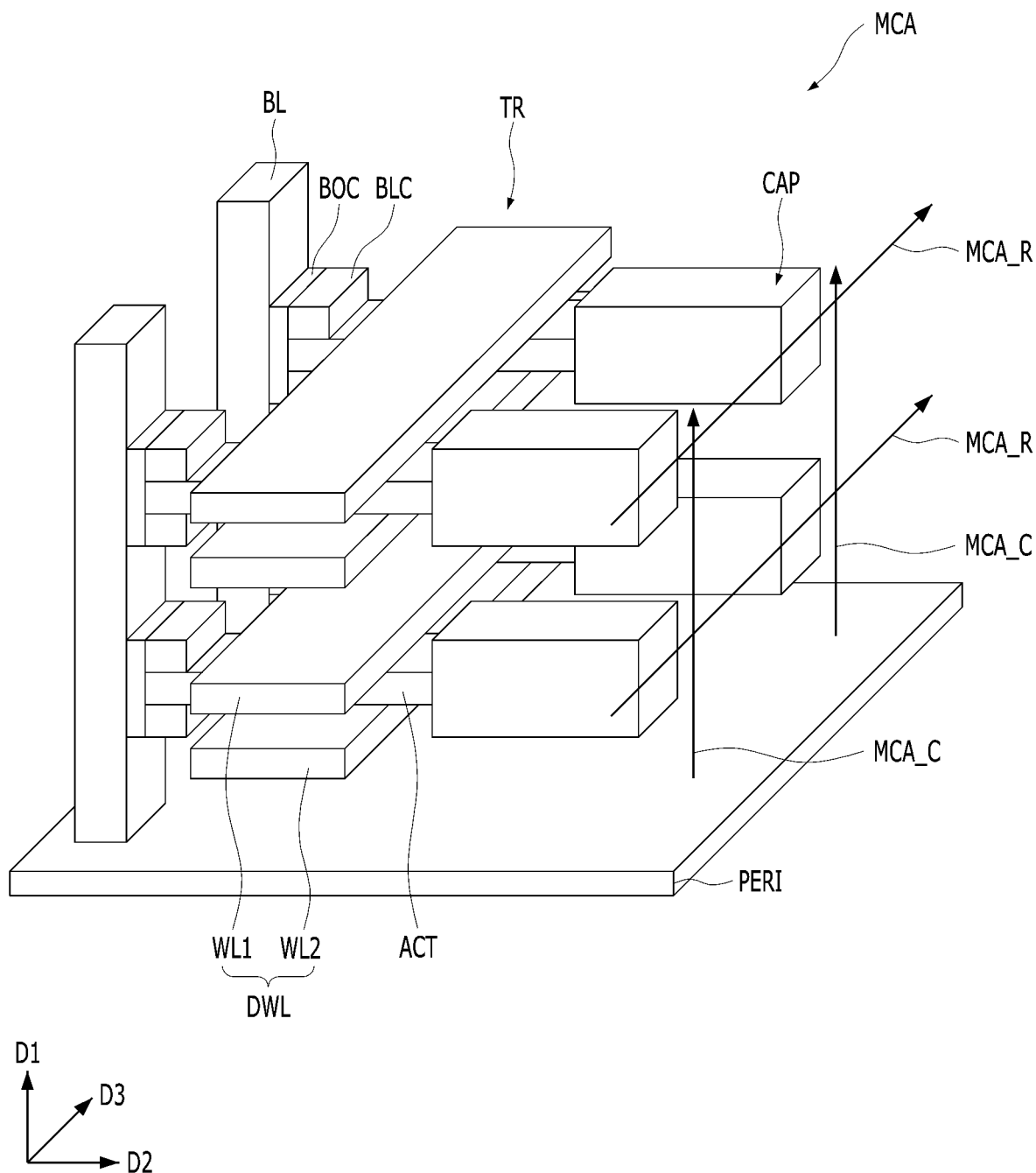
FIG. 3 is a schematic perspective view illustrating a semiconductor memory device according to another embodiment of the present invention.
Figure 4:
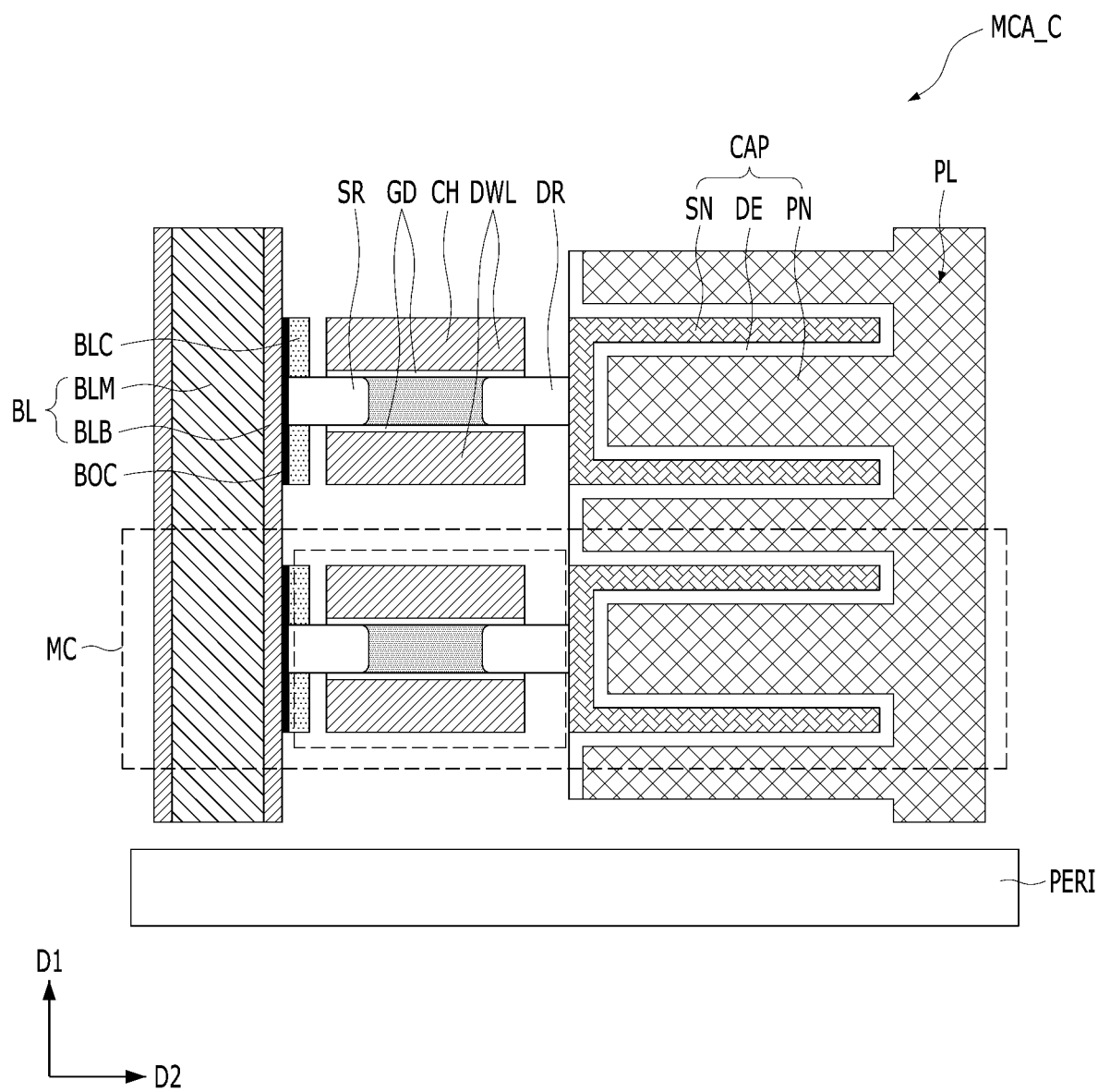
FIG. 4 is a schematic cross-sectional view illustrating a memory cell array of a semiconductor memory device according to another embodiment of the present invention.
Figure 5:
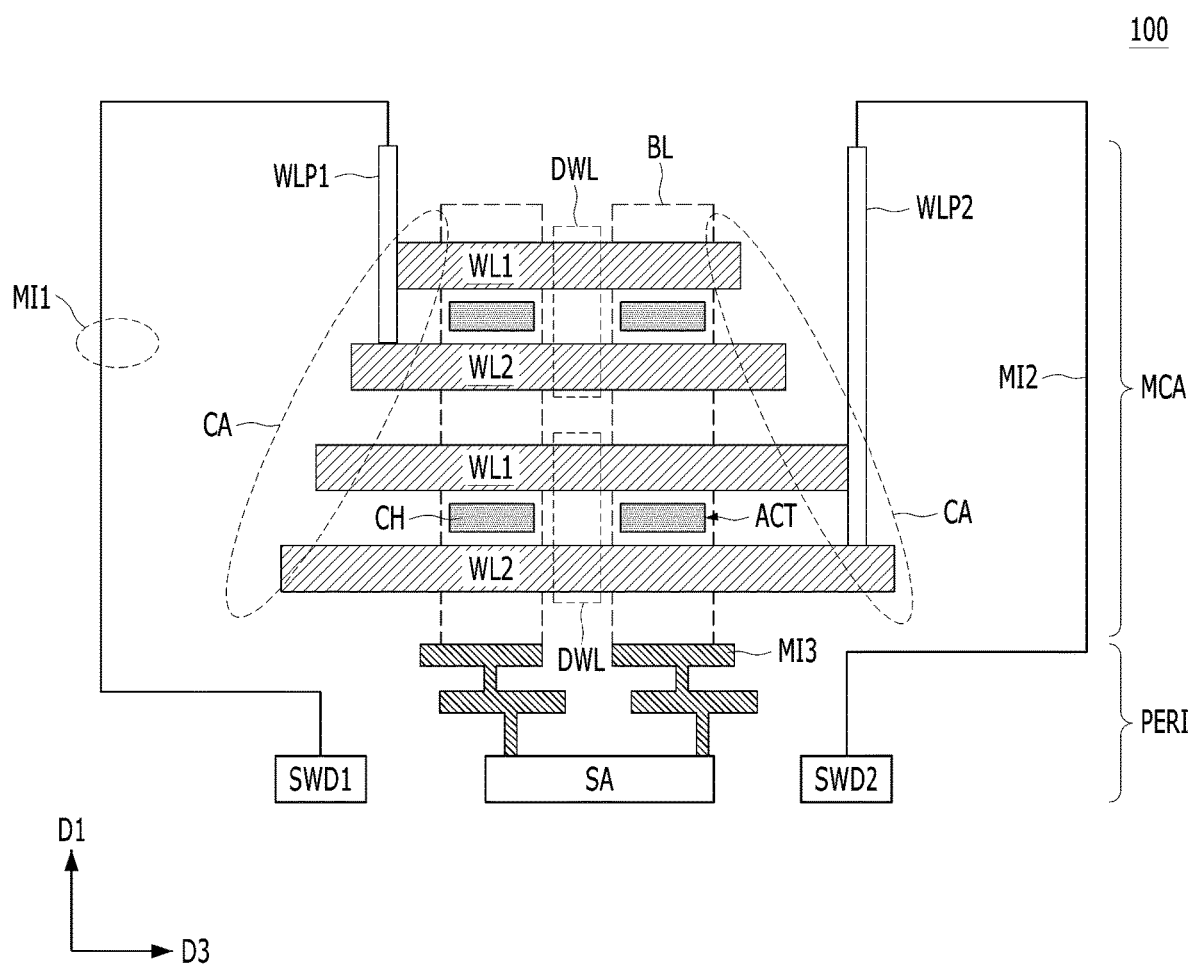
FIG. 5 is a cross-sectional view illustrating edge portions of double word lines.

FIG. 3 is a schematic perspective view of a semiconductor memory device according to one embodiment of the present invention. FIG. 4 is a cross-sectional view of a vertical memory cell array MCA_C of FIG. 3. FIG. 5 is a cross-sectional view illustrating edge portions of double word lines.

Referring to FIGS. 3 to 5, the semiconductor memory device 100 may include a memory cell array MCA. Multiple memory cells composed of memory cell MC of FIG. 1 may be arranged in the first to third directions D1, D2, and D3 and form the memory cell array MCA of FIG. 3. The memory cell array MCA may form a three-dimensional memory cell array of the memory cells MC, and the three-dimensional memory cell array may include a vertical memory cell array MCA_C and a lateral memory array MCA_R. The vertical memory cell array MCA_C refers to an array of memory cells MC vertically arranged in the first direction D1. The lateral memory cell array MCA_R refers to an array of memory cells MC that are laterally arranged in the third direction D3. The vertical memory cell array MCA_C may be referred to as a column array of memory cells MC, and the lateral memory cell array MCA_R may be referred to as a row array of memory cells MC. The bit line BL may be vertically oriented to be connected to the vertical memory cell array MCA_C, and the double word line DWL may be laterally oriented to be connected to the lateral memory cell array MCA_R. The bit line BL connected to the vertical memory cell array MCA_C may be referred to as a common bit line, and the vertical memory cell arrays MCA_C adjacent to each other along the third direction D3 may be connected to different common bit lines. The double word line DWL connected to the lateral memory cell array MCA_R may be referred to as a common double word line Common DWL, and adjacent lateral memory cell arrays MCA_R along the first direction D1 may be connected to different common double word lines.

The memory cell array MCA may include a plurality of memory cells MC, and each memory cell MC may include a vertically oriented bit line BL, a laterally oriented active layer ACT, a double word line DWL, and a laterally oriented capacitor CAP. For example, FIG. 3 illustrates a three-dimensional DRAM memory cell array including four memory cells MC.

The active layers ACT adjacent to each other in the first direction D1 may share one bit line BL. The active layers ACT adjacent to each other along the third direction D3 may share the double word line DWL. The capacitors CAP may be connected to the active layers ACT, respectively. The capacitors CAP may share one plate line PL. The individual active layers ACT may be thinner than the first and second word lines WL1 and WL2 of the double word line DWL.

In the memory cell array MCA shown in FIG. 3, a plurality of double word lines DWL may be vertically stacked in the first direction D1. The individual double word line DWL may include a pair of a first word line WL1 and a second word line WL2. A plurality of the active layers ACT may be laterally arranged and spaced apart from each other in the third direction D3 between the first and second word lines WL1 and WL2. The channel CH of the active layer ACT may be positioned between the first word line WL1 and the second word line WL2.

Referring back to FIG. 5, edge portions on both sides of each double word lines DWL may have a step shape, and the step shape may define contact portions CA. Each of the first word lines WL1 and the second word lines WL2 may include edge portions on both sides, that is, the contact portions CA. Each of the contact portions CA may have a step shape.

A plurality of word line pads WLP1 and WLP2 may be respectively connected to the contact portions CA. For example, the first word line pad WLP1 may be connected to the upper-level double word line DWL, that is, the contact portions CA of the first and second word lines WL1 and WL2 at the upper level. The second word line pad WLP2 may be connected to the lower-level double word line DWL, that is, the contact portions CA of the first and second word lines WL1 and WL2 at the lower level. The first and second word lines WL1 and WL2 at the upper level may be interconnected by a first word line pad WLP1. The first and second word lines WL1 and WL2 at the lower level may be interconnected by the second word line pad WLP2.

The semiconductor memory device 100 may further include a substrate PERI, and the substrate PERI may include a peripheral circuit portion. Hereinafter, the substrate PERI is abbreviated as a peripheral circuit portion PERI. The bit line BL of the memory cell array MCA may be vertically oriented to the surface of the peripheral circuit portion PERI along the first direction D1, and the double word line DWL may be oriented parallel to the surface of the peripheral circuit portion PERI along the third direction D3.

The peripheral circuit portion PERI may be disposed at a lower level than the memory cell array MCA. This structure is referred to hereinafter as a COP (Cell over PERI) structure. The peripheral circuit portion PERI may include at least one control circuit for driving the memory cell array MCA. At least one control circuit of the peripheral circuit portion PERI may include an N-channel transistor, a P-channel transistor, a CMOS circuit, or a combination thereof. At least one control circuit of the peripheral circuit portion PERI may include an address decoder circuit, a read circuit, a write circuit, and the like. At least one control circuit of the peripheral circuit portion PERI may include a planar channel transistor, a recess channel transistor, a buried gate transistor, a fin field-effect transistor (FinFET), and the like.

For example, the peripheral circuit portion PERI may include sub word line drivers SWD1 and SWD2 and a sense amplifier SA. The upper-level double word line DWL may be connected to the first sub word line driver SWD1 through the first word line pads WLP1 and the first metal interconnections MI1. The lower-level double word line DWL may be connected to the second sub word line driver SWD2 through the second word line pads WLP2 and the second metal interconnections MI2. The bit lines BL may be connected to the sense amplifier SA through the third metal interconnections MI3. The third metal interconnection MI3 may have a multi-level metal (MLM) structure including a plurality of vias and a plurality of metal lines.

Figure 6:
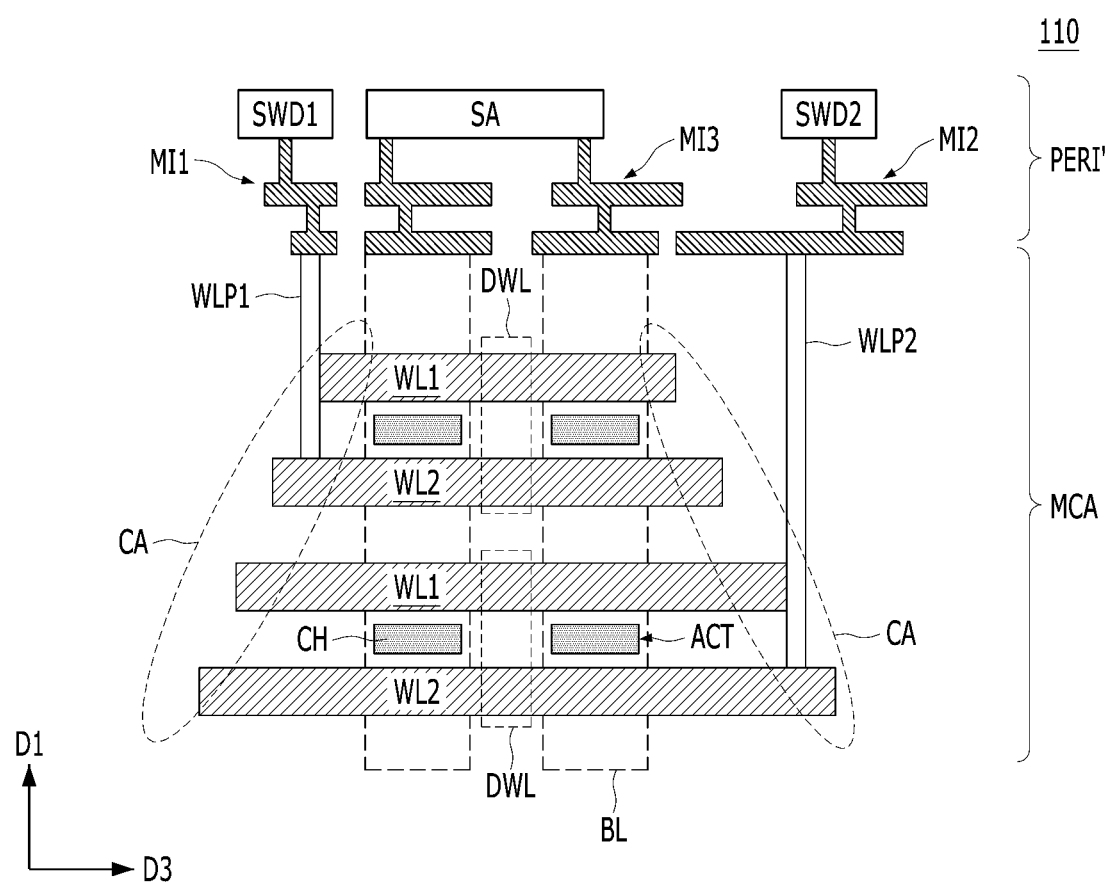
FIG. 6 is a cross-sectional view illustrating a semiconductor memory device according to another embodiment of the present invention.

FIG. 6 is a schematic cross-sectional view illustrating a memory cell array of a semiconductor memory device according to another embodiment of the present invention. FIG. 6 illustrates a semiconductor memory device 110 having a POC (PERI over Cell) structure. In FIG. 6, detailed descriptions of the duplicate components with those of FIG. 5 may be omitted.

Referring to FIG. 6, the semiconductor memory device 110 may include a memory cell array MCA and a peripheral circuit portion PERI'. The peripheral circuit portion PERI' may be positioned at a higher level than the memory cell array MCA. This structure is referred to hereinafter as a POC (PERI over Cell) structure.

The peripheral circuit portion PERI' may include sub word line drivers SWD1 and SWD2 and a sense amplifier SA. The upper-level double word line DWL may be connected to the first sub word line driver SWD1 through the first word line pads WLP1 and the first metal interconnections MI1. The lower-level double word line DWL may be connected to the second sub word line driver SWD2 through the second word line pads WLP2 and the second metal interconnections MI2. The bit lines BL may be connected to the sense amplifier SA through the third metal interconnections MI3. The third metal interconnections MI3 may have a multi-level metal structure including a plurality of vias and a plurality of metal lines.

Figure 7:
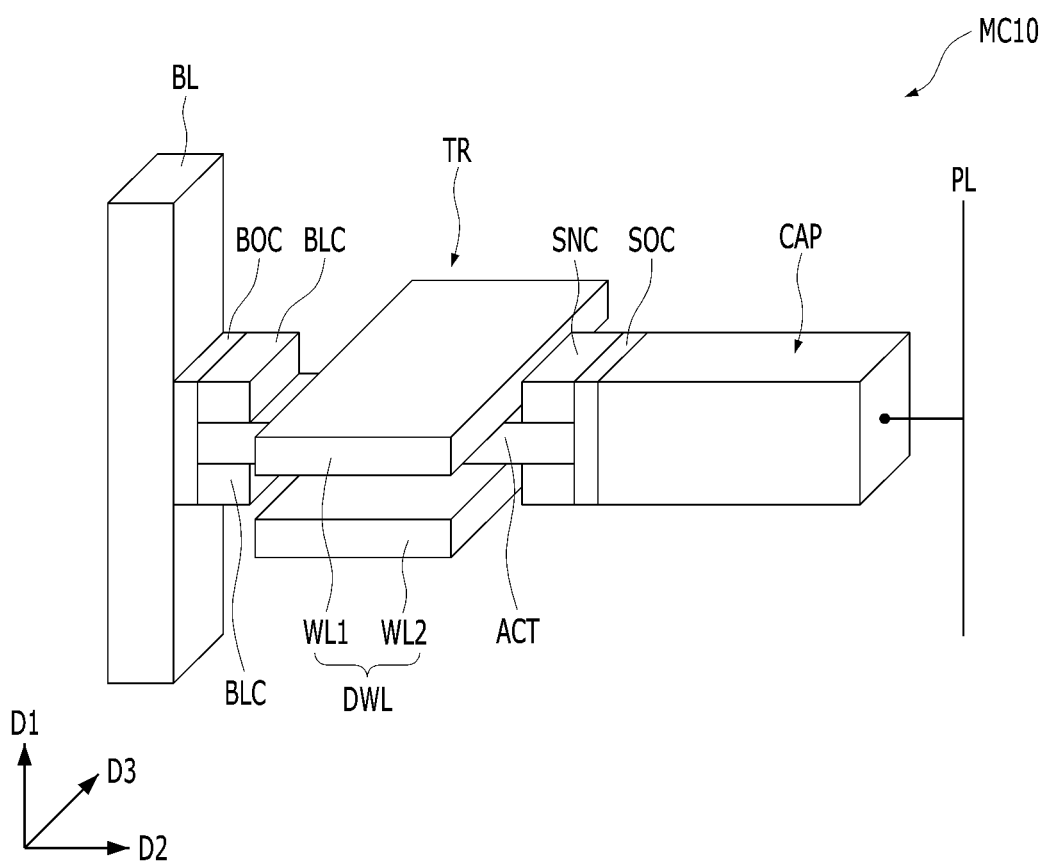
FIG. 7 is a schematic perspective view illustrating a memory cell according to another embodiment of the present invention.
Figure 8:
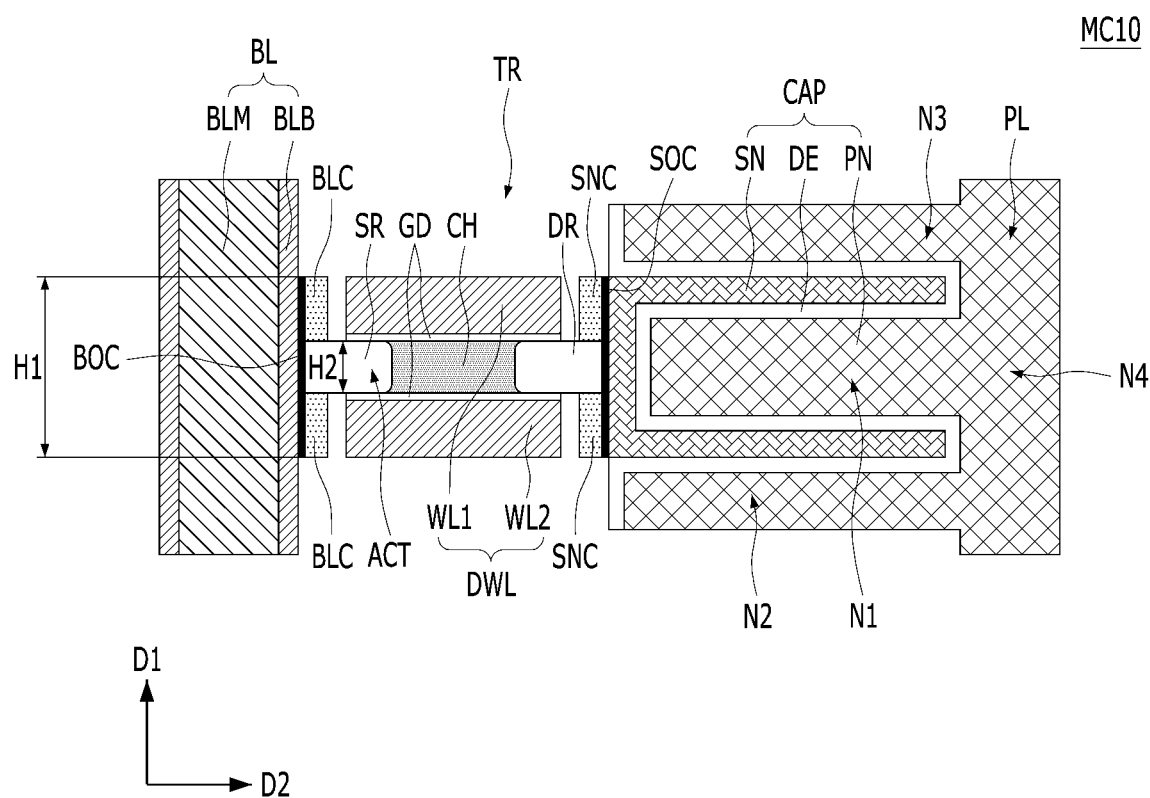
FIG. 8 is a cross-sectional view illustrating the memory cell of FIG. 7.

FIG. 7 is a schematic perspective view illustrating a memory cell of a semiconductor memory device according to another embodiment. FIG. 8 is a cross-sectional view of the semiconductor memory device of FIG. 7. In FIGS. 7 and 8, detailed descriptions of duplicate components with those of FIGS. 1 and 2 may be omitted.

Referring to FIGS. 7 and 8, the memory cell MC10 of the 3D semiconductor memory device may include a bit line BL, a transistor TR, and a capacitor CAP. The transistor TR may include an active layer ACT, a gate dielectric layer GD, and a double word line DWL (W1, W2). The active layer ACT may include a first source/drain region SR, a second source/drain region DR, and a channel CH between the first source/drain region SR and the second source/drain region DR. The capacitor CAP may include a storage node SN, a dielectric layer DE, and a plate node PN. The bit line BL may have a pillar shape extending in a first direction D1. The active layer ACT may have a bar shape extending in a second direction D2 intersecting the first direction D1. The double word line DWL may have a line shape extending in a third direction D3 intersecting the first direction D1 and the second direction D2. The double word line DWL may include a first word line WL1 and a second word line WL2. The plate node PN of the capacitor CAP may be connected to the plate line PL.

A bit line side-ohmic contact BOC may be formed between the first source/drain region SR and the bit line BL. The bit line side-ohmic contact BOC and the first source/drain region SR may be commonly connected to bit line contact nodes BLC. The bit line contact nodes BLC may be respectively connected to an upper surface and a lower surface of the first source/drain region SR. The bit line contact nodes BLC may have a double structure that the bit line contact nodes BLC are disposed on an upper surface and a lower surface of the first source/drain region SR, respectively. The bit line side-ohmic contact BOC may be positioned between the bit line contact nodes BLC and the bit line BL. The height H1 of the bit line side-ohmic contact BOC may be increased by the bit line contact nodes BLC. A contact area between the bit line BL and the bit line side-ohmic contact BOC may be increased. A contact area between the bit line BL and the first source/drain region SR may also be increased.

The bit line contact node BLC may include polysilicon, for example, polysilicon doped with an N-type impurity. The height of the bit line side-ohmic contact BOC, that is, the thickness H1 of the bit-line side-ohmic contact BOC in the first direction D1 may be greater than the thickness H2 of the active layer ACT in the first direction D1. The bit line side-ohmic contact BOC may have a height fully covering side surfaces of the bit line contact nodes BLC and the first source/drain region SR.

The bit line side-ohmic contact BOC may be formed when the silicon of the bit line contact node BLC and the first source/drain region SR react with a metal of the bit line BL. The bit line side-ohmic contact BOC may include metal silicide.

A storage node side-ohmic contact SOC may be formed between the second source/drain region DR and the storage node SN. The storage node side-ohmic contact SOC and the second source/drain region DR may be commonly connected to storage contact nodes SNC. The storage contact nodes SNC may be connected to an upper surface and a lower surface of the second source/drain region DR, respectively. The storage contact nodes SNC may have a double structure that the storage contact nodes SNC are disposed on an upper surface and a lower surface of the second source/drain region DR, respectively. The storage node side-ohmic contact SOC may be disposed between the storage contact nodes SNC and the storage node SN. The height H1 of the storage node side-ohmic contact SOC may be increased by the storage contact node SNC, thereby increasing a contact area between the storage node SN and the storage node side-ohmic contact SOC. A contact area between the storage node SN and the second source/drain region DR may be increased.

The storage node side-ohmic contact SOC and the bit line side-ohmic contact BOC may have the same height. The storage contact nodes SNC may include polysilicon, for example, polysilicon doped with an N-type impurity. The height of the storage node side-ohmic contact SOC, that is the thickness H1 of the storage node side-ohmic contact SOC in the first direction D1, may be greater than the thickness H2 of the active layer ACT in the first direction D1. The second source/drain region DR may be doped with an N-type impurity diffused from the storage contact node SNC. The storage node side-ohmic contact SOC may have a height fully covering side surfaces of the storage contact nodes SNC and the second source/drain region DR.

The storage node side-ohmic contact SOC may be formed when the silicon of the storage contact node SNC and the second source/drain region DR react with a metal. The storage node side-ohmic contact SOC may include metal silicide.

Figure 9:
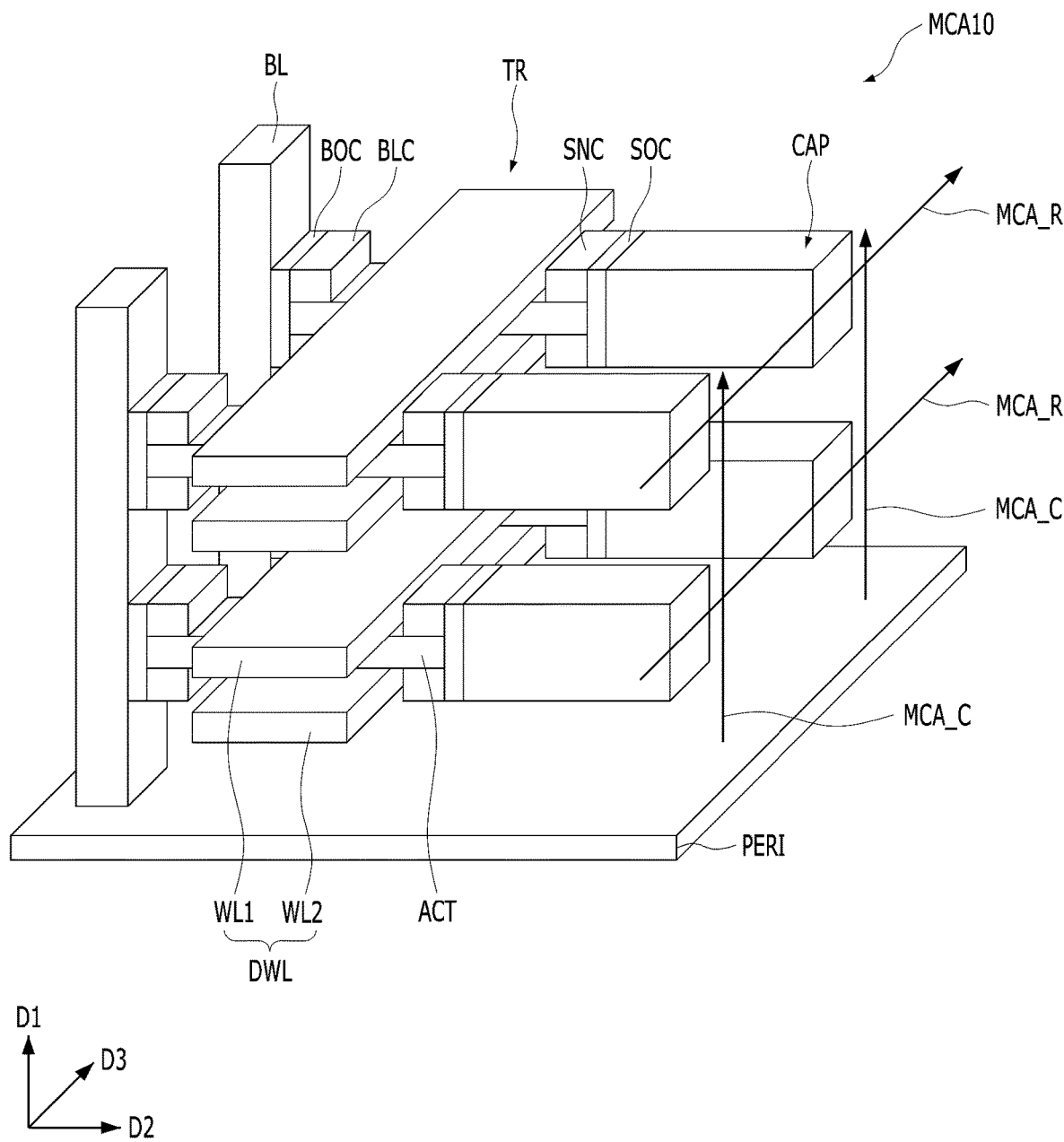
FIG. 9 is a schematic perspective view illustrating a semiconductor memory device according to another embodiment of the present invention.

FIG. 9 is a schematic perspective view illustrating a semiconductor memory device according to another embodiment of the present invention. In FIG. 9, detailed descriptions of duplicate components with those of FIGS. 3 and 4 may be omitted.

Referring to FIG. 9, the semiconductor memory device 120 may include a memory cell array MCA10. The memory cells MC10 of FIG. 7 may be arranged in the first to third directions D1, D2, and D3 to form the memory cell array MCA10 of FIG. 9. The memory cell array MCA10 may include a three-dimensional array of the memory cells MC10, and the three-dimensional memory cell array may include vertical memory cell arrays MCA_C and lateral memory arrays MCA_R. The vertical memory cell array MCA_C refers to an array of memory cells MC10 vertically arranged in the first direction D1. The lateral memory cell array MCA_R refers to an array of memory cells MC10 that are laterally arranged along the third direction D3. The vertical memory cell array MCA_C may be referred to as a column array of memory cells MC10, and the lateral memory cell array MCA_R may be referred to as a row array of memory cells MC10. The bit lines BL may be vertically oriented to be connected to the vertical memory cell array MCA_C, and the double word lines DWL may be laterally oriented to be connected to the lateral memory cell array MCA_R. The bit line BL connected to the vertical memory cell array MCA_C may be referred to as a common bit line, and adjacent vertical memory cell arrays MCA_C along the third direction D3 may be connected to different common bit lines, respectively. The double word line DWL connected to the lateral memory cell array MCA_R may be referred to as a common double word line Common DWL, and adjacent lateral memory cell arrays MCA_R along the first direction D1 may be connected to different common double word lines.

The memory cell array MCA10 may include a plurality of the memory cells MC10, and each memory cell MC10 may include a vertically oriented bit line BL, a laterally oriented active layer ACT, a double word line DWL, and a laterally oriented capacitor CAP. FIG. 9 illustrates a three-dimensional DRAM memory cell array including four memory cells MC10.

Active layers ACT adjacent to each other in the first direction D1 may be connected to one bit line BL. The active layers ACT adjacent to each other along the third direction D3 may share the same double word line DWL. The capacitors CAP may be connected to the active layers ACT, respectively. The capacitors CAP may share one plate line PL. The individual active layers ACT may be thinner than the first and second word lines WL1 and WL2 of the double word line DWL.

In the memory cell array MCA10, a plurality of double word lines DWL may be vertically stacked in the first direction D1. Each double word line DWL may include a pair of the first word line WL1 and the second word line WL2. Between the first word line WL1 and the second word line WL2, a plurality of active layers ACT may be laterally arranged and spaced apart from each other in the third direction D3. The channels CH of the active layers ACT may be positioned between the first word line WL1 and the second word line WL2.

Similar to that shown in FIG. 5, in the double word lines DWL of the memory cell array MCA10 of FIG. 9, step shaped contact portions may be defined at edge portions on both sides.

Similar to that shown in FIGS. 5 and 6, the semiconductor memory device 120 of FIG. 9 may include the COP or POC structure.

The transistors according to the above-described embodiments may be applied to a double gate (DG) field effect transistor, a fin field-effect transistor (FinFET), a gate all-around (GAA) field effect transistor, and a multi-bridge thin-body channel field effect transistor.

FIGS. 10A to 10H are diagrams illustrating a method for fabricating a semiconductor memory device according to various embodiments of the present invention.

Figure 10A:
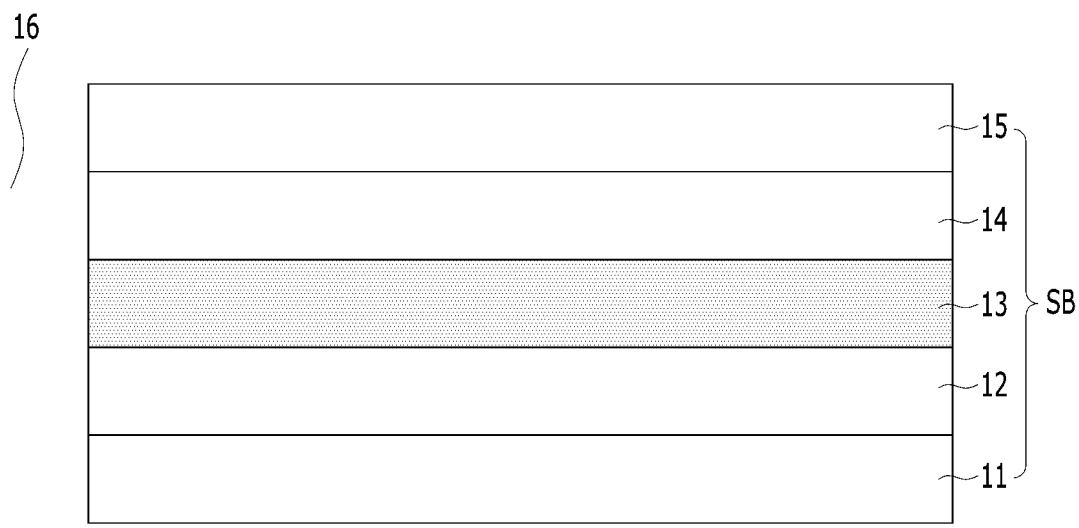
FIGS. 10A to 10H are diagrams illustrating a method for fabricating a semiconductor device according to embodiments of the present invention.

As shown in FIG. 10A, a stack body SB may be formed. The stack body SB may include inter-dielectric layers 11 and 15, sacrificial layers 12 and 14, and a semiconductor layer 13. The semiconductor layer 13 may be disposed between the lower inter-dielectric layer 11 and the upper inter-dielectric layer 15. The lower sacrificial layer 12 may be disposed between the lower inter-dielectric layer 11 and the semiconductor layer 13, and the upper sacrificial layer 14 may be disposed between the upper inter-dielectric layer 15 and the semiconductor layer 13. The inter-dielectric layers 11 and 15 may include silicon oxide, and the sacrificial layers 12 and 14 may include silicon nitride. The semiconductor layer 13 may include a semiconductor material or an oxide semiconductor material. The semiconductor layer 13 may include monocrystalline silicon, polysilicon, or IGZO (Indium Gallium Zinc Oxide).

A first opening 16 may be formed by etching the stack body SB. The first opening 16 may have a hole shape vertically penetrating through the stack body SB.

A plurality of semiconductor layers 13 may be formed between the sacrificial layers 12 and 14. For example, similar to the active layer ACT shown in FIG. 3, a plurality of semiconductor layers 13 may be laterally arranged on the same plane. For example, forming the plurality of semiconductor layers 13 may include: forming the stack body SB in which the sacrificial layers 12 and 14 are disposed on the inter-dielectric layers 11 and 15, respectively, and the semiconductor layer of a plane shape is formed between the sacrificial layers 12 and 14; forming a plurality of device separation holes by etching the stack body SB; and forming a plurality of semiconductor layer patterns which are laterally arranged between the sacrificial layers 12 and 14 by recess-etching the semiconductor layers of a plane shape through the device separation hole(s).

Figure 10B:
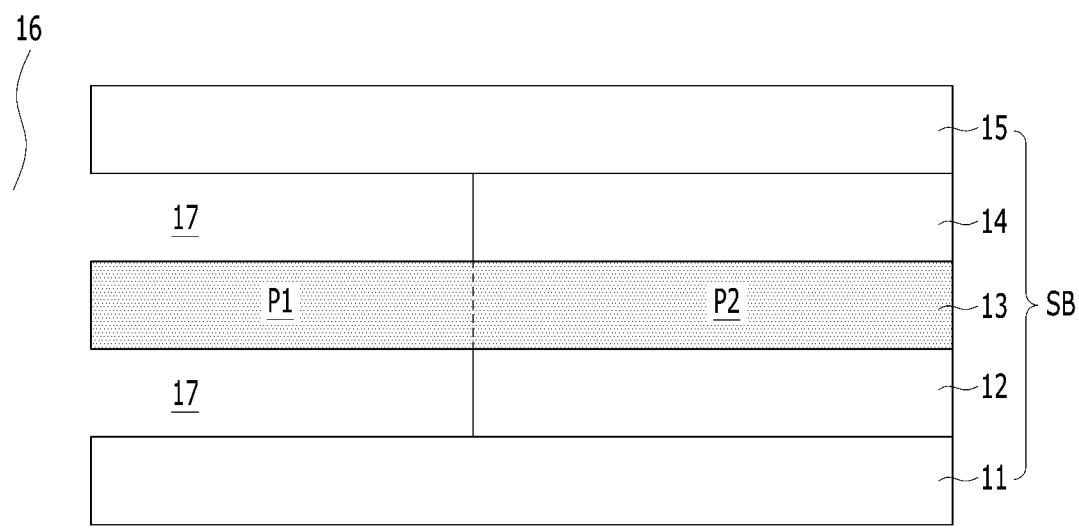

As shown in FIG. 10B, recesses 17 may be formed by selectively etching the sacrificial layers 12 and 14. A portion of the semiconductor layer 13 may be exposed by the recesses 17. An upper recess of the recesses 17 may be formed between the semiconductor layer 13 and the upper inter-dielectric layer 15, and a lower recess of the recesses 17 may be formed between the semiconductor layer 13 and the lower inter-dielectric layer 11. Hereinafter, a portion of the semiconductor layer 13 exposed by the recesses 17 is referred to hereinafter as a 'first portion P1'. The first portion P1 of the semiconductor layer 13 may refer to a portion in which the channel CH and the first source/drain regions SR are to be formed as described in the above-described embodiments. A portion of the semiconductor layer 13 covered by the sacrificial layers 12 and 14 is referred to hereinafter as a 'second portion P2'.

Figure 10C:
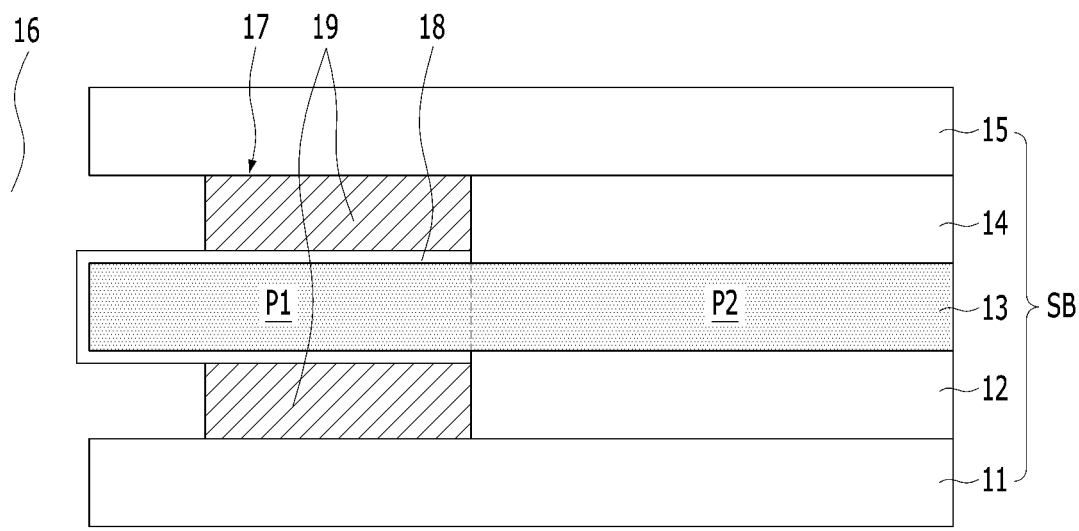

As shown in FIG. 10C, a gate dielectric layer 18 may be formed on the first portion P1 of the semiconductor layer 13.

The gate dielectric layer 18 may be selectively formed on the surfaces of the first portion P1 of the active layer by an oxidation process. In another embodiment, the gate dielectric layer 18 may be formed by a deposition process, and in this case, the gate dielectric layer 18 may be formed on the surfaces of the recesses 17 and the surfaces of the first portion P1 of the semiconductor layer 13.

Next, a double word line 19 may be formed by filling each of the recesses 17 with a conductive material. The double word line 19 may include polysilicon, titanium nitride, tungsten, or a combination thereof. For example, forming the double word line 19 may include conformally depositing titanium nitride, depositing tungsten on the titanium nitride to fill the recesses 17, and performing etch-back on the titanium nitride and tungsten. The double word line 19 may partially fill the recesses 17, and thus a portion of the gate dielectric layer 18 may be exposed. The double word lines 19 may face each other vertically with the first portion P1 of the semiconductor layer 13 interposed therebetween.

Figure 10D:
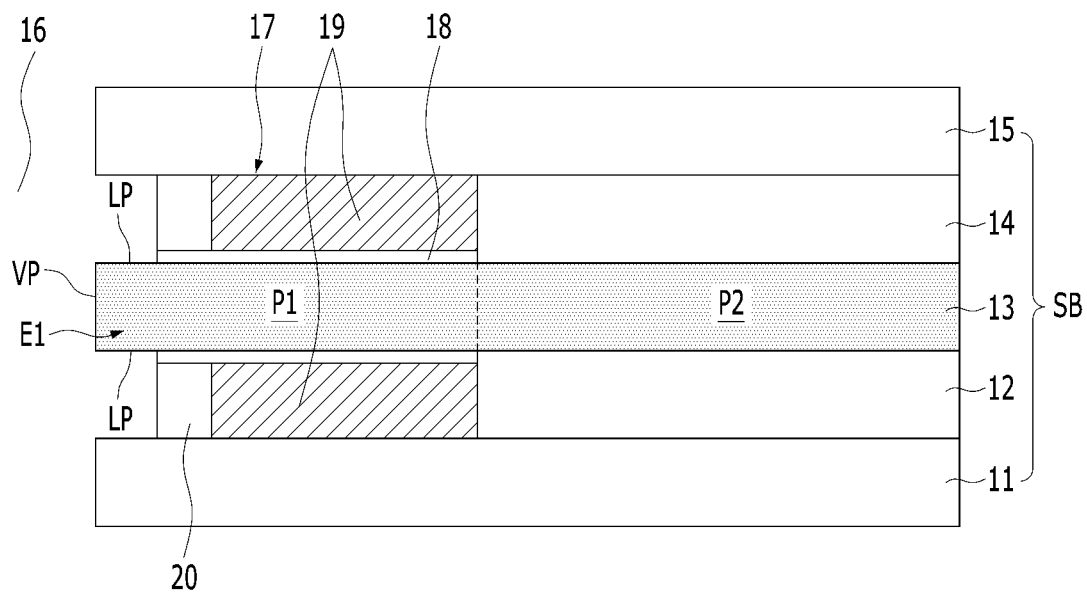

As shown in FIG. 10D, liner layers 20 in contact with one side of the double word line 19 may be formed. Liner layers 20 may be disposed in the recesses 17. The liner layers 20 may include silicon oxide or silicon nitride. The liner layers 20 may be disposed in portions of the recesses 17. That is, an empty space (or an air gap) may remain on one side of the liner layers 20.

Next, a first end E1 of the first portion P1 may be exposed by etching a portion of the gate dielectric layer 18 which is exposed by the liner layers 20. Hereinafter, the first end E1 of the first portion P1 is abbreviated as a 'first end E1'. The first end E1 of the semiconductor layer 13 may include horizontal flat surfaces LP and a vertical flat surface VP between the horizontal flat surfaces LP. The vertical flat surface VP may be exposed by the first opening 16, and the horizontal flat surfaces LP may be exposed by the empty spaces provided on one side of the liner layers 20.

Figure 10E:
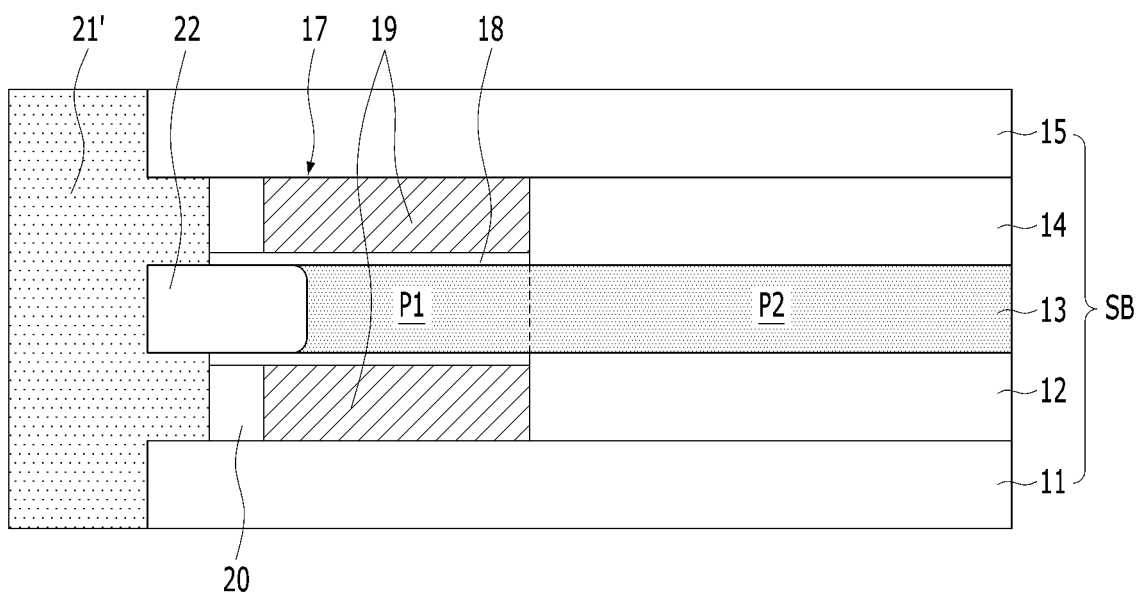

As shown in FIG. 10E, an impurity-containing conductive layer 21' may fill the first opening 16. The conductive layer 21' may be polysilicon containing an N-type impurity such as phosphorous. A portion of the conductive layer 21' may fill the empty space provided on one side of the liner layers 20. The conductive layer 21' may directly contact the first end E1 of the semiconductor layer 13. The conductive layer 21' may cover the vertical flat surface VP and the horizontal flat surfaces LP of the first end E1.

A subsequent heat treatment may be performed to diffuse impurities from the conductive layer 21' into the semiconductor layer 13. Accordingly, the first source/drain region 22 may be formed in the first portion P1 of the semiconductor layer 13.

Figure 10F:
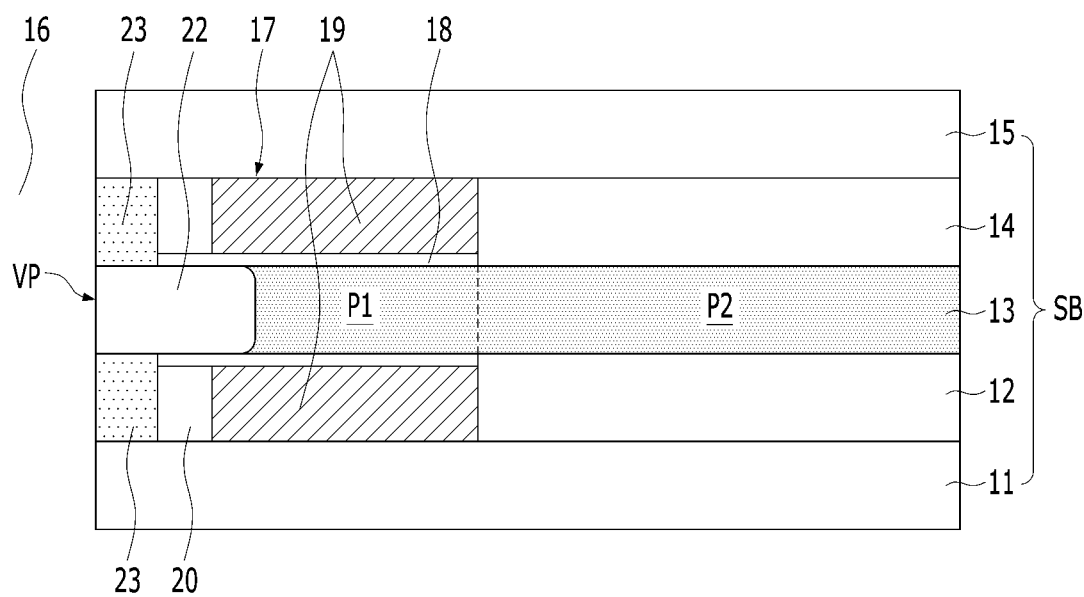

As shown in FIG. 10F, bit line contact nodes 23 may be formed by recessing the conductive layer 21'. The bit line contact nodes 23 may fill the remaining spaces of the recesses 17. The bit line contact nodes 23 may fill the empty spaces provided on one side of the liner layers 20. The bit line contact nodes 23 may be vertically disposed with the first source/drain region 22 interposed therebetween. The bit line contact nodes 23 may be formed on upper and lower surfaces of the first source/drain region 22, respectively. A combination of the bit line contact nodes 23 and the first source/drain region 22 may form a horizontally oriented T shape. One side of the first source/drain region 22 may be self-aligned to one side of the bit line contact nodes 23. Thus, the vertical flat surface VP of the first end E1 may be exposed.

In one embodiment, the recesses 17 may be filled with the double word line 19, liner layers 20, and bit line contact nodes 23.

Figure 10G:
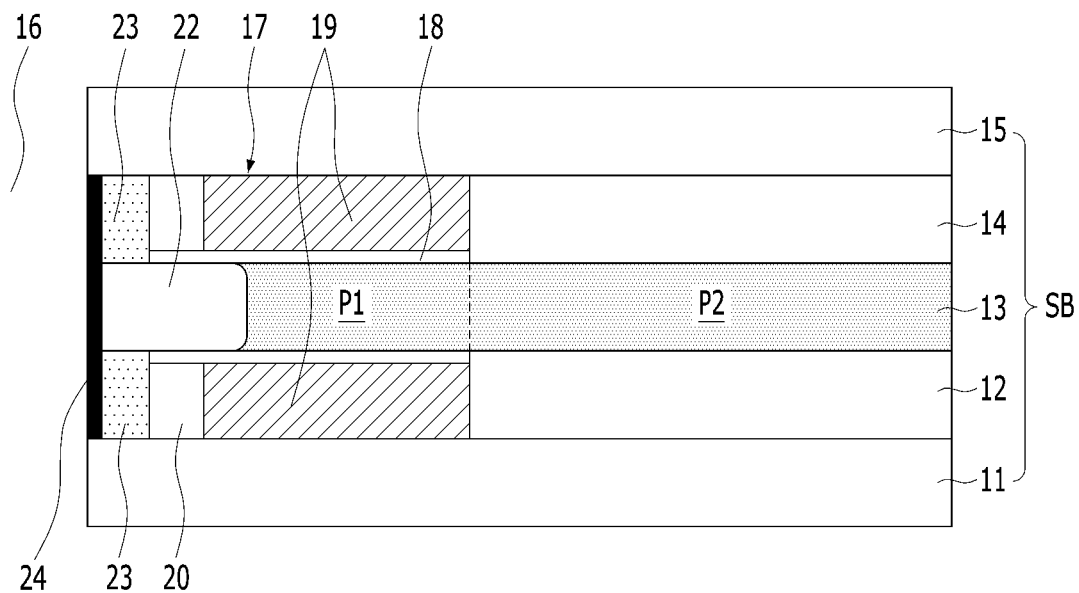

As shown in FIG. 10G, the bit line side-ohmic contact 24 may be formed on the bit line contact nodes 23 and the first source/drain region 22. The bit line side-ohmic contact 24 may include metal silicide. For example, metal silicide may be formed by depositing a metal layer on the contact nodes 23 and the first source/drain region 22 and sequentially annealing the metal layer, and an unreacted metal layer may be removed. The metal silicide may be formed when the silicon of the bit line contact nodes 23 and the first source/drain region 22 react with the metal layer. The bit line side-ohmic contact 24 may simultaneously cover one side of the bit line contact nodes 23 and one side of the first source/drain region 22.

Figure 10H:
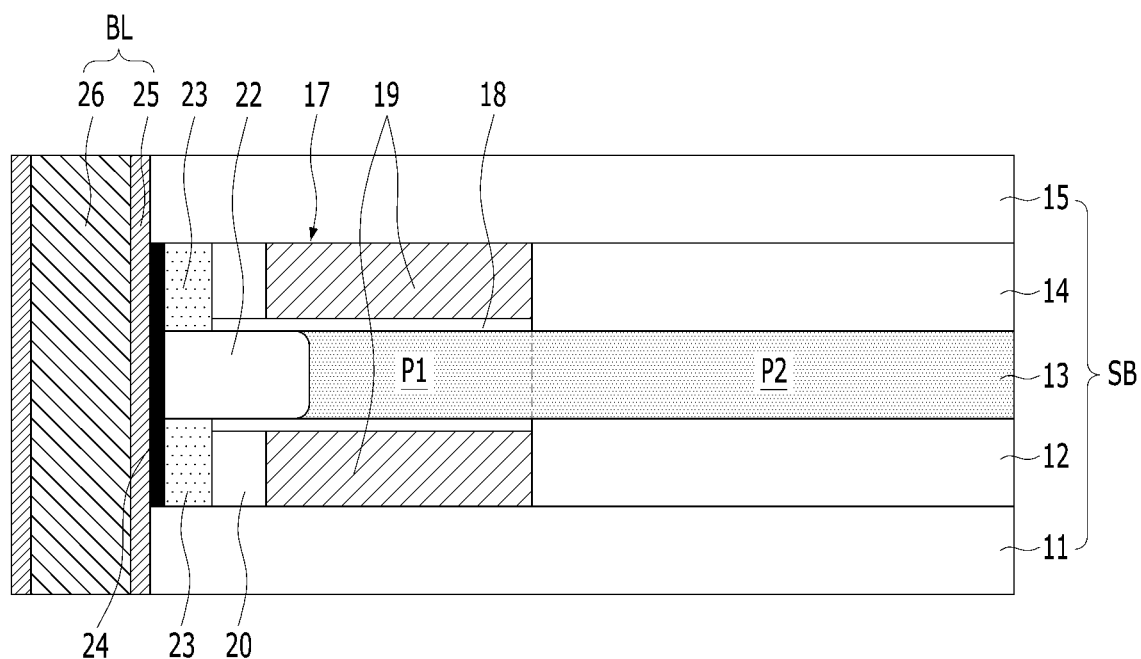

As shown in FIG. 10H, a bit line BL in contact with the bit line side-ohmic contact 24 may be formed. The bit line BL may have a pillar shape filling the first opening 16. The bit line BL may include a bit line barrier 25 and a bit line body 26, and the bit line barrier 25 may contact the bit line side-ohmic contact 24. The bit line barrier 25 may include titanium nitride, and the bit line body 26 may include tungsten.

In another embodiment, the bit line side-ohmic contact 24 may be formed while the bit line barrier 25 is formed. For example, a titanium/titanium nitride (Ti/TiN) stack may be deposited as a bit line barrier 25 and annealed. At this time, titanium may be silicidated and form titanium silicide, the titanium silicide may serve as the bit line side-ohmic contact 24, and the titanium nitride may become the bit line barrier 25.

FIGS. 11A to 11G illustrate a method for fabricating a semiconductor memory device according to another embodiment of the present invention. The method for fabricating a capacitor described in FIGS. 11A to 11G is according to an embodiment of the present invention, and may be performed after the bit line BL of FIG. 10H is formed.

Figure 11A:
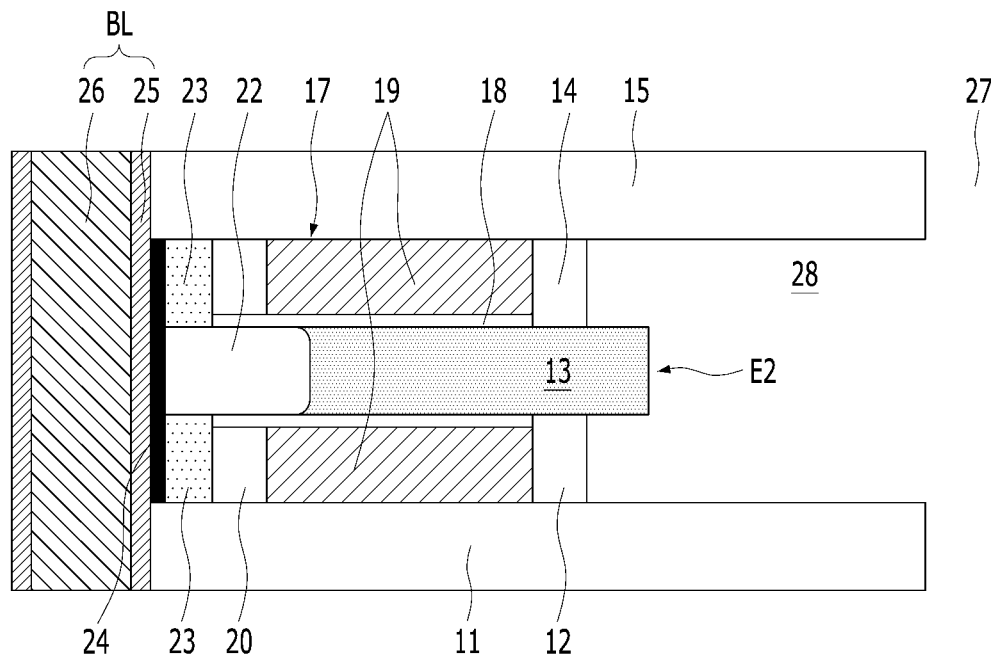
FIGS. 11A to 11G are diagrams illustrating a method for fabricating a semiconductor memory device according to another embodiment of the present invention.

As shown in FIG. 11A, a second opening 27 may be formed by etching a different portion of the stack body SB. The second opening 27 may extend vertically. The second opening 27 may have a hole shape passing through the different portion of the stack body SB.

Next, the sacrificial layers 12 and 14 and the second portion P2 of the semiconductor layer 13 may be selectively recessed through the second opening 27. Accordingly, a capacitor opening 28 may be formed between the inter-dielectric layers 11 and 15. After performing the processes of forming the second opening 27 and the capacitor opening 28, the remaining semiconductor layer 13 is abbreviated as an 'active layer 13'. A double word line 19 may be formed with the active layer 13 interposed therebetween.

Next, the sacrificial layers 12 and 14 may be further recessed. Accordingly, an empty space (or an air gap) may be provided on one side of the sacrificial layers 12 and 14, and a second end E2 of the active layer 13 may be exposed by the empty space. Similar to the first end E1, the second end E2 may include horizontal flat surfaces and vertical flat surface between the horizontal flat surfaces. A vertical flat surface may be exposed by the capacitor opening 28, and a horizontal flat surface may be exposed by an empty space provided on one side of the sacrificial layers 12 and 14. The remaining sacrificial layers 12 and 14 may cover the side surface of the double word line 19.

Figure 11B:
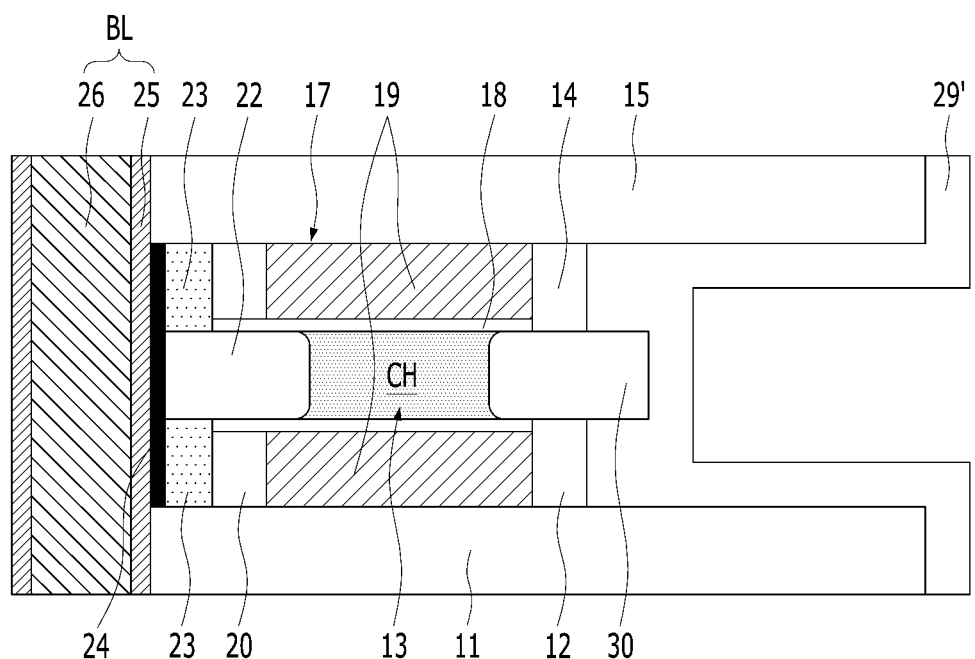

As shown in FIG. 11B, a conductive layer 29' including an impurity may be formed. The conductive layer 29' may be polysilicon containing an N-type impurity such as phosphorous. A portion of the conductive layer 29' may fill an empty space provided on one side of the sacrificial layers 12 and 14. The conductive layer 29' may directly contact the second end E2 of the active layer 13. The conductive layer 29' may cover the vertical and horizontal flat surfaces of the second end E2.

A subsequent heat treatment may be performed to diffuse impurities from the conductive layer 29' into the active layer 13. Accordingly, a second source/drain region 30 may be formed at the second end E2 of the active layer 13. The first source/drain region 22 and the second source/drain region 30 may be formed to be laterally spaced apart from each other in the active layer 13, and a channel CH may be defined between the first source/drain region 22 and the second source/drain region 30.

Figure 11C:
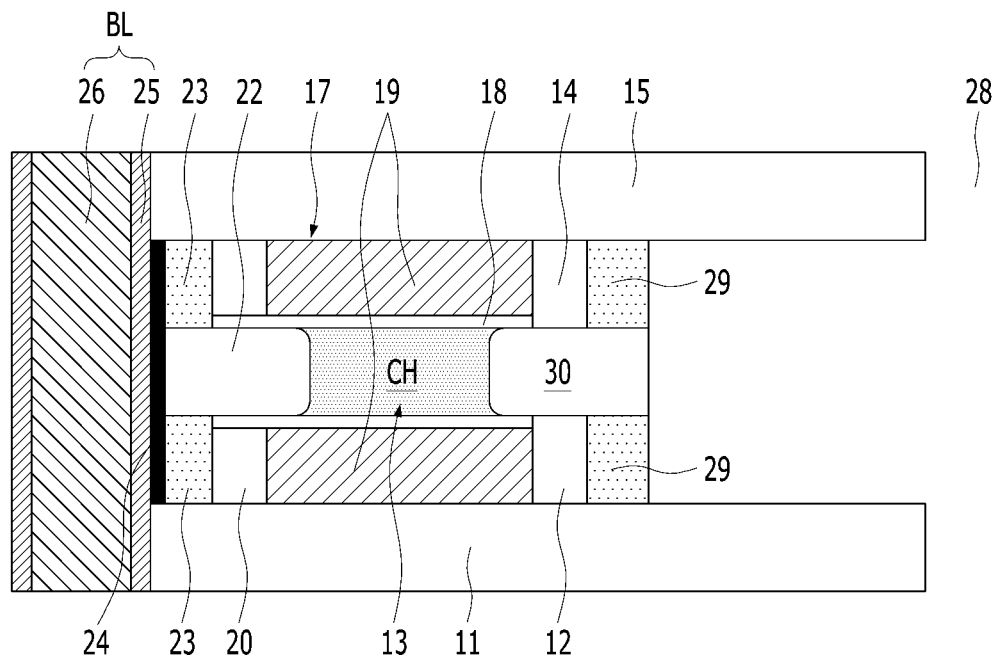
Figure 11D:
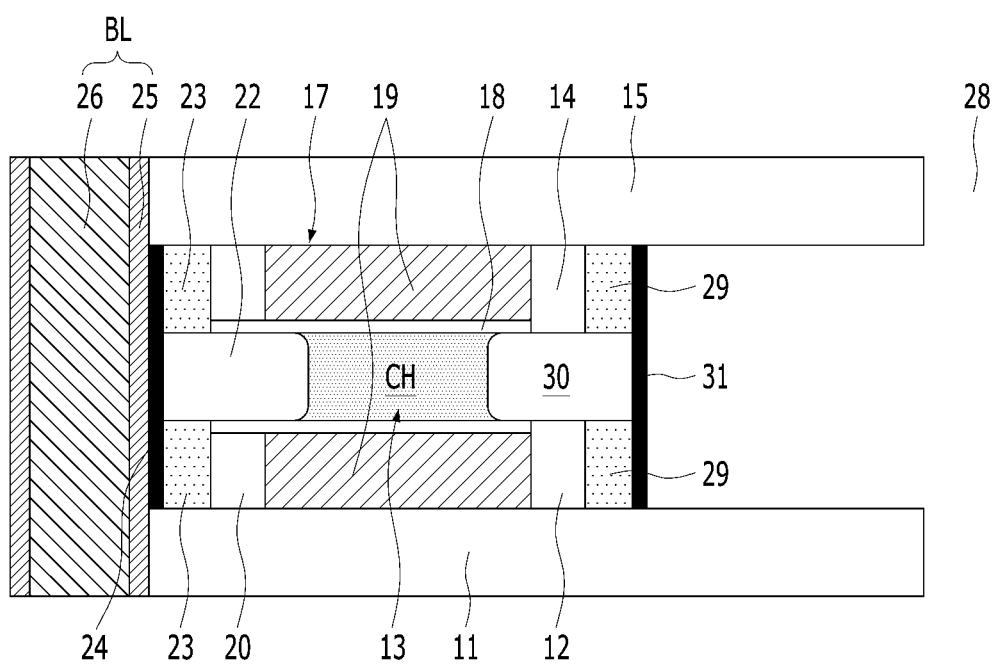

As shown in FIG. 11C, the conductive layer 29' may be recessed to form storage contact nodes 29. The storage contact nodes 29 may fill the empty space provided on one side of the sacrificial layers 12 and 14. The storage contact nodes 29 may be vertically positioned with the second source/drain region 30 interposed therebetween. The storage contact nodes 29 may be formed on an upper surface and a lower surface of the second source/drain region 30, respectively. A combination of the storage contact nodes 29 and the second source/drain region 30 may form a horizontally oriented T-shape. A vertical flat surface of the second source/drain region 30 may be exposed by being self-aligned to one side of the storage contact nodes 29.

As shown in 11D, the storage node side-ohmic contact 31 may be formed on the storage contact nodes 29 and the second source/drain region 30. The storage node side-ohmic contact 31 may include metal silicide. For example, metal silicide may be formed and the unreacted metal layer may be removed by sequentially depositing a metal layer on the storage contact nodes 29 and the second source/drain region 30 and annealing the metal layer. The metal silicide may be formed when a metal layer reacts with the silicon of the storage contact nodes 29 and the second source/drain region 30. The storage node side-ohmic contact 31 may simultaneously cover one side of the storage contact nodes 29 and one side of the second source/drain region 30.

Figure 11E:
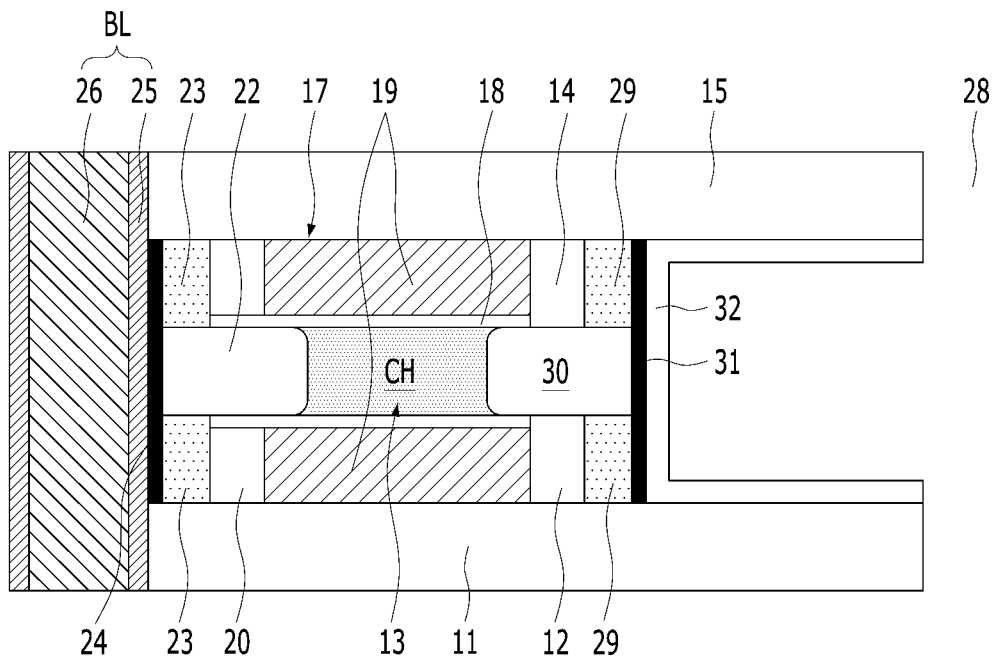
Figure 11F:
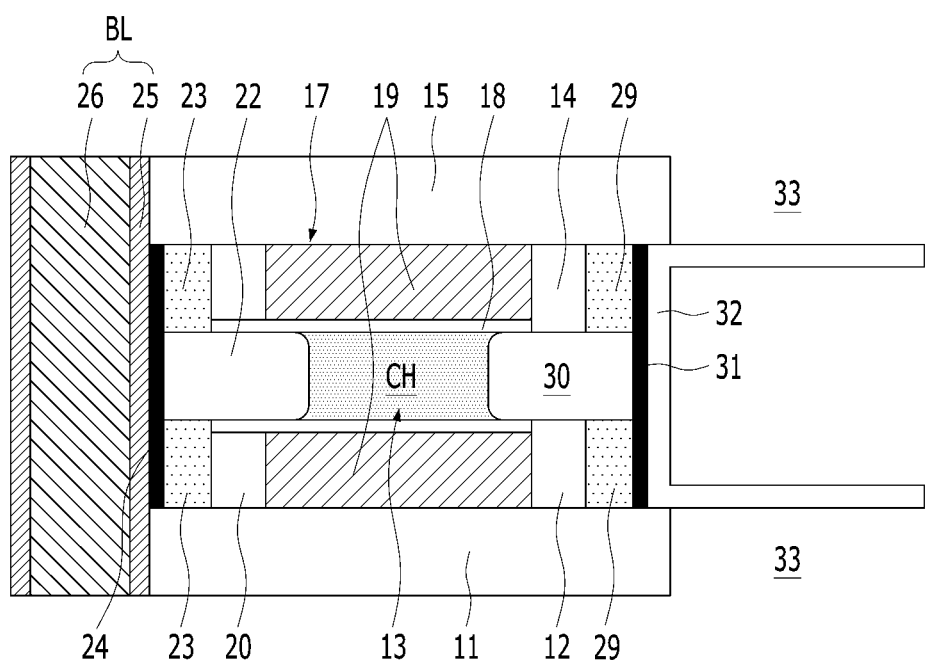

As shown in FIG. 11E, a storage node 32 in contact with the storage node side-ohmic contact 31 may be formed. To form the storage node 32, a conductive material may be deposited and an etch-back process may be performed on the conductive material. The storage node 32 may include titanium nitride. The storage node 32 may have a laterally oriented cylindrical shape.

As shown in 11F, an outer wall of the storage node 32 may be exposed by recessing the inter-dielectric layers 11 and 15 (refer to reference numeral 33).

Figure 11G:
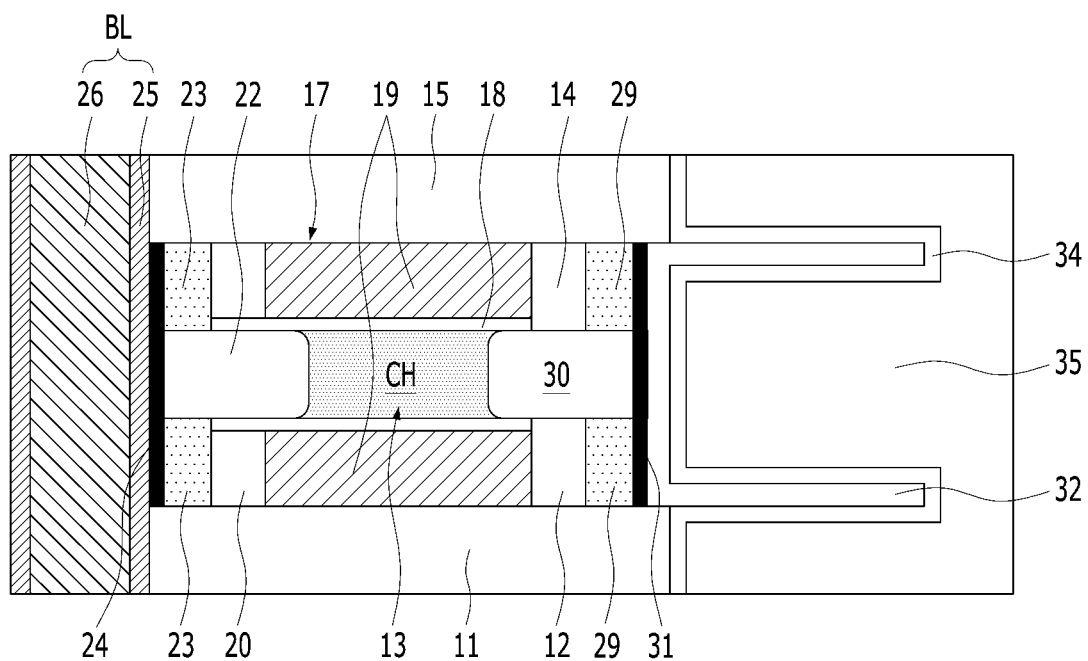

As shown in FIG. 11G, a dielectric layer 34 and a plate node 35 may be sequentially formed over the storage node 32.

Figure 12:
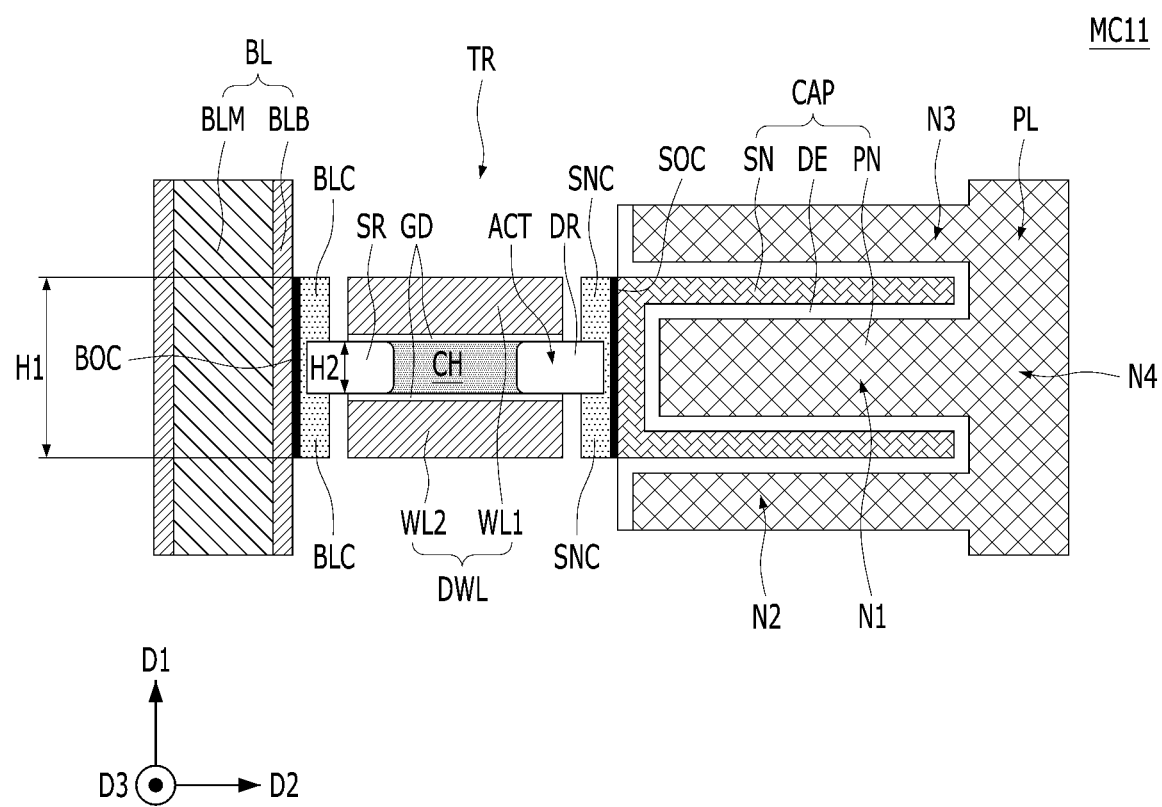
FIG. 12 is a schematic cross-sectional view illustrating a memory cell according to another embodiment of the present invention.

FIG. 12 is a cross-sectional view illustrating a memory cell according to another embodiment of the present invention. The memory cell MC11 of FIG. 12 may be similar to the memory cell MC of FIG. 2.

Referring to FIG. 12, the memory cell MC11 may include a bit line BL, a transistor TR, and a capacitor CAP. The transistor TR may include an active layer ACT, a gate dielectric layer GD, and a double word line DWL. The active layer ACT may include a first source/drain region SR, a second source/drain region DR, and a channel CH between the first source/drain region SR and the second source/drain region DR. The capacitor CAP may include a storage node SN, a dielectric layer DE, and a plate node PN. The bit line BL may have a pillar shape extending in a first direction D1. The active layer ACT may have a bar shape extending in a second direction D2 intersecting the first direction D1. The double word line DWL may have a line shape extending in a third direction D3 intersecting the first direction D1 and the second direction D2. The double word line DWL may include a first word line WL1 and a second word line WL2. The plate node PN of the capacitor CAP may be connected to the plate line PL.

A bit line side-ohmic contact BOC may be formed between the first source/drain region SR and the bit line BL. The bit line side-ohmic contact BOC and the first source/drain region SR may be commonly connected to a bit line contact node BLC. The bit line contact node BLC may cover an upper surface, a lower surface, and one side surface of the first source/drain region SR. The bit line contact node BLC may have a single structure that simultaneously covers the upper surface, the lower surface, and one side surface of the first source/drain region SR. The bit line side-ohmic contact BOC may be disposed between the bit line contact node BLC and the bit line BL. The height H1 of the bit line side-ohmic contact BOC may be increased by the bit-line contact node BLC. A contact area between the bit line BL and the bit line side-ohmic contact BOC may be increased. A contact area between the bit line BL and the first source/drain region SR may also be increased.

The bit line contact node BLC may include polysilicon, for example, polysilicon doped with an N-type impurity. The height of the bit line side-ohmic contact BOC, that is, a thickness H1 of the bit-line side-ohmic contact BOC in the first direction D1, may be greater than a thickness H2 of the active layer ACT in the first direction D1. The bit line side-ohmic contact BOC may have a height fully covering one side of the bit line contact node BLC.

The bit line side-ohmic contact BOC may be formed when the silicon of the bit line contact node BLC reacts with the metal of the bit line BL. The bit line side-ohmic contact BOC may include metal silicide.

A storage node side-ohmic contact SOC may be formed between the second source/drain region DR and the storage node SN. The storage node side-ohmic contact SOC and the second source/drain region DR may be commonly connected to the storage contact node SNC. The storage contact node SNC may cover an upper surface, a lower surface, and one side of the second source/drain region DR. The storage contact node SNC may have a single structure that simultaneously covers the upper surface, the lower surface, and one side of the second source/drain region DR. The storage node side-ohmic contact SOC may be disposed between the storage contact node SNC and the storage node SN. The height H1 of the storage node side-ohmic contact SOC may be increased by the storage contact node SNC, thereby increasing a contact area between the storage node SN and the storage node side-ohmic contact SOC. The contact area between the storage node SN and the second source/drain region DR may be increased.

The storage node side-ohmic contact SOC and the bit line side-ohmic contact BOC may have the same height. The storage contact node SNC may include polysilicon, for example, polysilicon doped with an N-type impurity. The height of the storage node side-ohmic contact SOC, that is, the thickness H1 of the storage node side-ohmic contact SOC in the first direction D1, may be greater than the thickness H2 of the active layer ACT in the first direction D1. The second source/drain region DR may be doped with an N-type impurity diffused from the storage contact node SNC. The storage node side-ohmic contact SOC may have a height that fully covers one side of the storage contact node SNC.

The storage node side-ohmic contact SOC may be formed when silicon of the storage contact node SNC reacts with a metal. The storage node side-ohmic contact SOC may include metal silicide.

According to FIG. 12, the bit line side-ohmic contact BOC and the first source/drain region SR may not directly contact each other, and the storage node side-ohmic contact SOC and the second source/drain region DR may not directly contact each other. The bit line side-ohmic contact BOC may directly contact the bit line contact node BLC. The storage node side-ohmic contact SOC may directly contact the storage node contact SNC.

FIGS. 13A to 13E are diagrams illustrating a method of fabricating a semiconductor memory device according to another embodiment of the present invention. The method shown in FIGS. 13A to 13E may proceed similarly to the method shown in FIGS. 10A to 10H.

First, as shown in FIGS. 10A to 10D, liner layers 20 in contact with one side of the double word line 19 may be formed. The liner layers 20 may be disposed in the recesses 17.

Next, the first end E1 of the first portion P1 of the semiconductor layer 13 may be exposed by etching a portion of the gate dielectric layer 18.

Figure 13A:
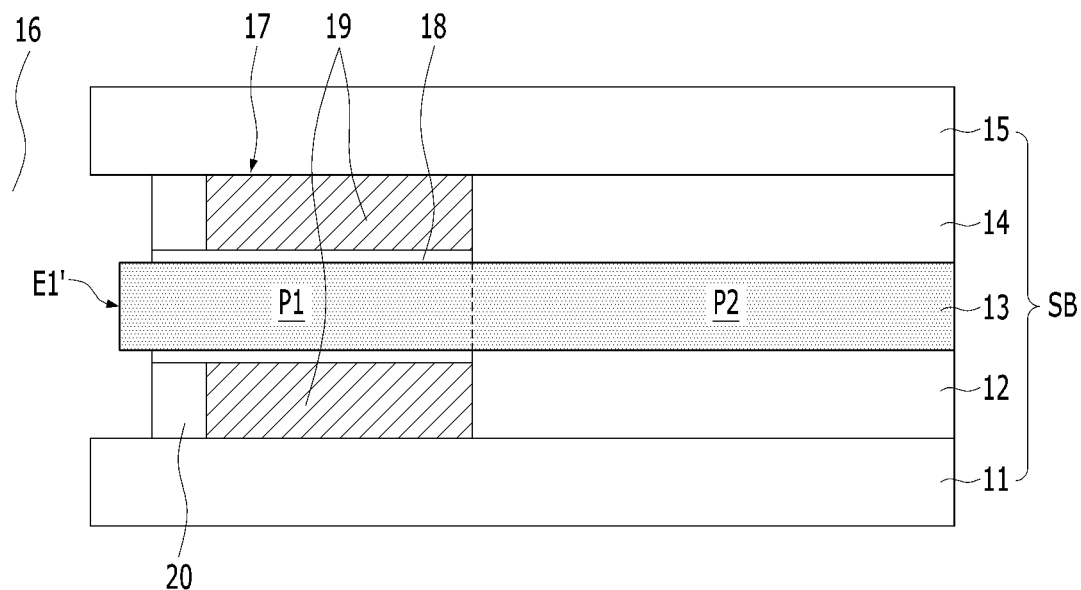
FIGS. 13A to 13E are diagrams illustrating a method for fabricating a semiconductor memory device according to another embodiment of the present invention.

As shown in FIG. 13A, the exposed first end E1 of the semiconductor layer 13 may be recessed in the lateral direction by a predetermined thickness. Accordingly, the first end E1' having a reduced lateral length may be formed.

Figure 13B:
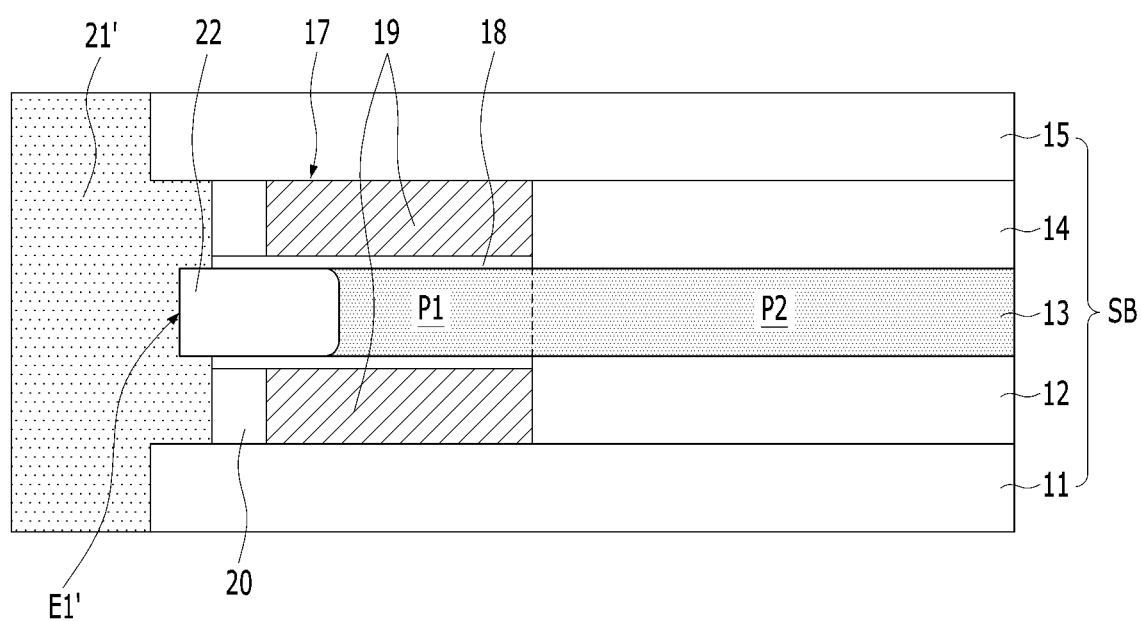

As shown in FIG. 13B, the opening 16 may be filled with a conductive layer 21' including an impurity. The conductive layer 21' may be polysilicon containing an N-type impurity such as phosphorous.

A subsequent heat treatment may be performed to diffuse impurities from the conductive layer 21' into the semiconductor layer 13. Accordingly, a first source/drain region 22 may be formed at the first end E1' of the semiconductor layer 13.

Figure 13C:
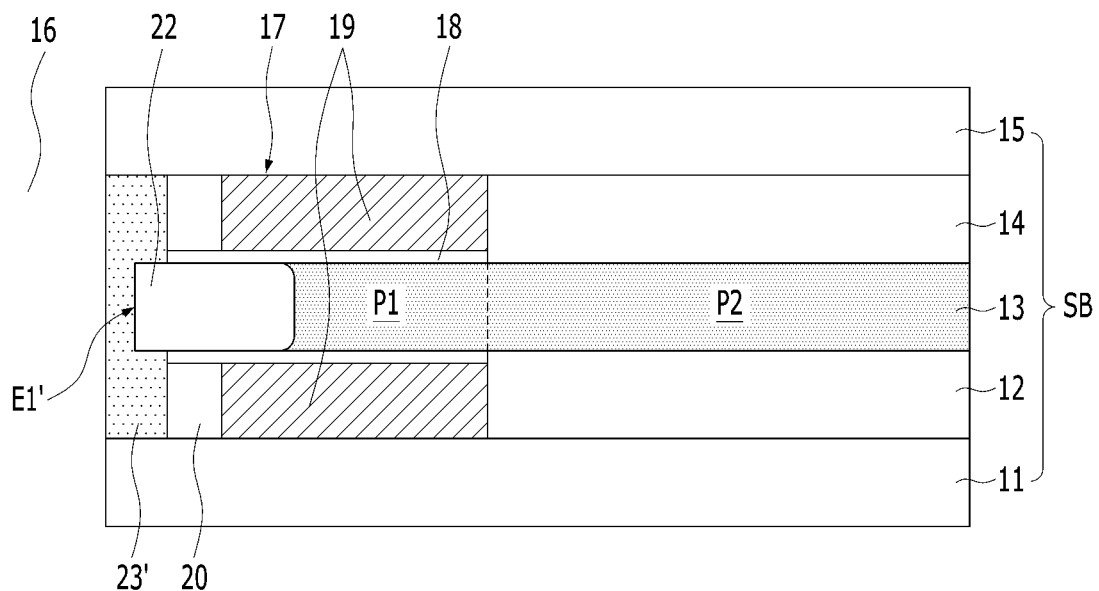

As shown in FIG. 13C, a bit line contact node 23' filling the remaining space of the recesses 17 may be formed by recessing the conductive layer 21'.

The recesses 17 may be filled with the double word line 19, the liner layers 20, and the bit line contact node 23'. The bit line contact node 23' may have a single structure and may simultaneously cover the vertical and flat surfaces of the first end E1' of the semiconductor layer 13.

Figure 13D:
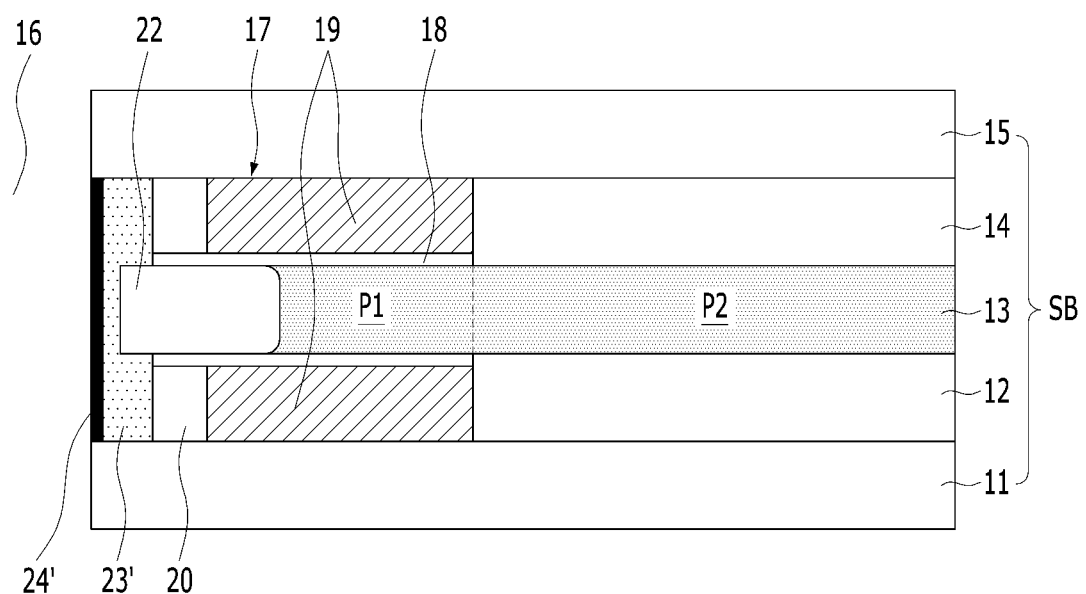

As shown in FIG. 13D, a bit line side-ohmic contact 24' may be formed on the bit line contact node 23'. The bit line side-ohmic contact 24' may include metal silicide. For example, metal silicide may be formed by sequentially depositing a metal layer on the bit line contact node 23' and annealing the metal layer, and unreacted metal layer may be removed. The metal silicide may be formed when the silicon of the bit line contact node 23' interacts with the metal layer.

Figure 13E:
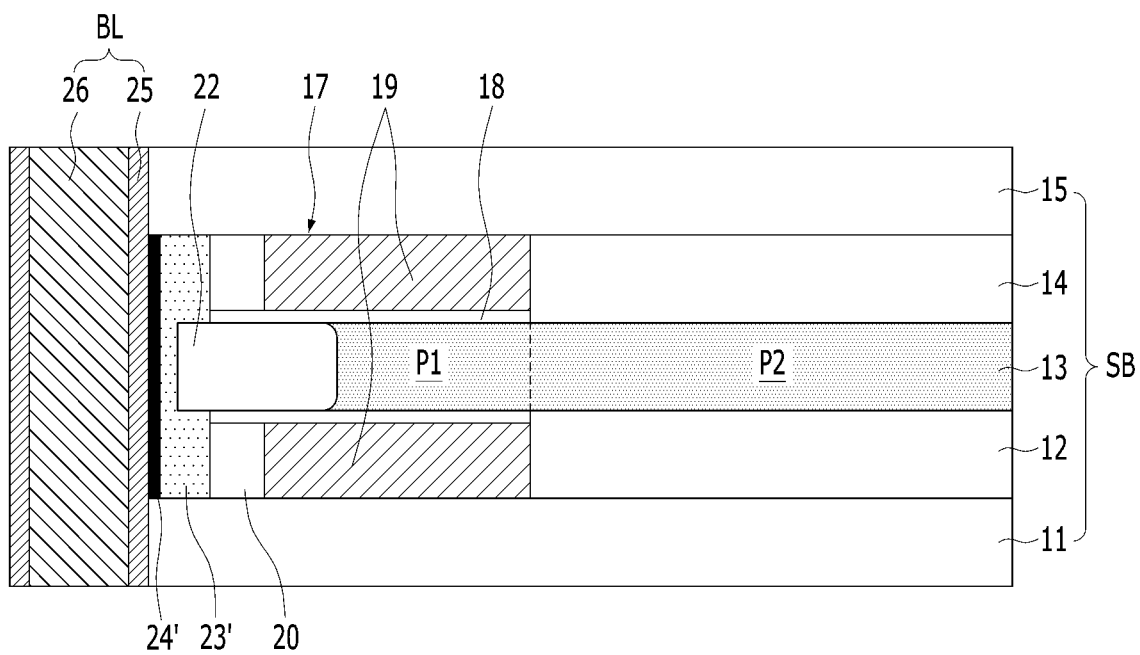

As shown in FIG. 13E, a bit line BL in contact with the bit line side-ohmic contact 24' may be formed. The bit line BL may include a bit line barrier 25 and a bit line body 26, and the bit line barrier 25 may contact the bit line side-ohmic contact 24'. The bit line barrier 25 may include titanium nitride, and the bit line body 26 may include tungsten.

In another embodiment of the present invention, the bit line side-ohmic contact 24' may be formed while the bit line barrier 25 is formed. For example, a titanium/titanium nitride (Ti/TiN) stack may be deposited as a bit line barrier 25 and annealed. At this time, titanium may be silicidated and form titanium silicide, the titanium silicide may serve as the bit line side-ohmic contact 24', and the titanium nitride may become the bit line barrier 25.

In one embodiment, the bit line contact node BLC of FIGS. 1 to 9 may be replaced with the bit line contact node 23'.

After the bit line BL is formed, a storage contact node and a capacitor may be formed as shown in FIGS. 11A to 11G. In another embodiment of the present invention, forming the storage contact node may be performed similar to the method of forming the bit line contact node 23' as shown in FIGS. 13A to 13E. Accordingly, the storage contact node may cover the vertical and flat surfaces of the second source/drain region 30.

Figure 14A:
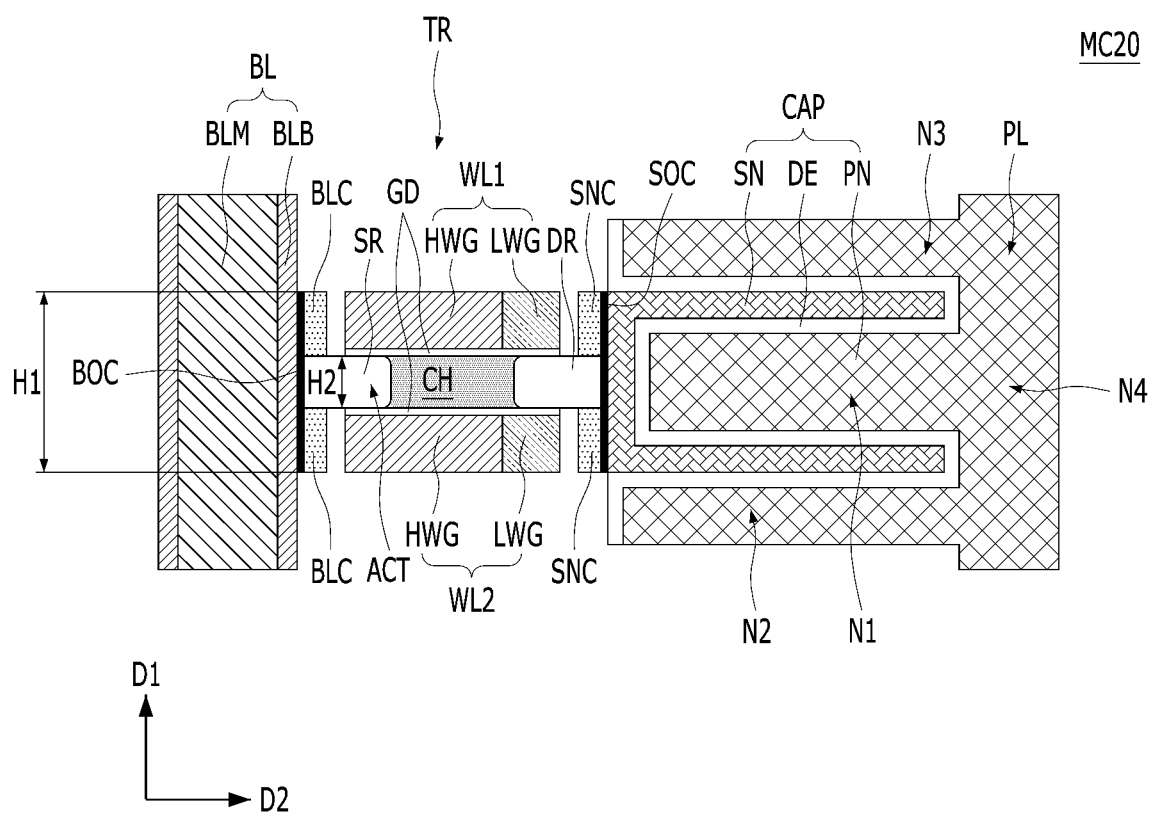
FIGS. 14A and 14B are schematic cross-sectional views illustrating memory cells according to embodiments of the present invention.
Figure 14B:
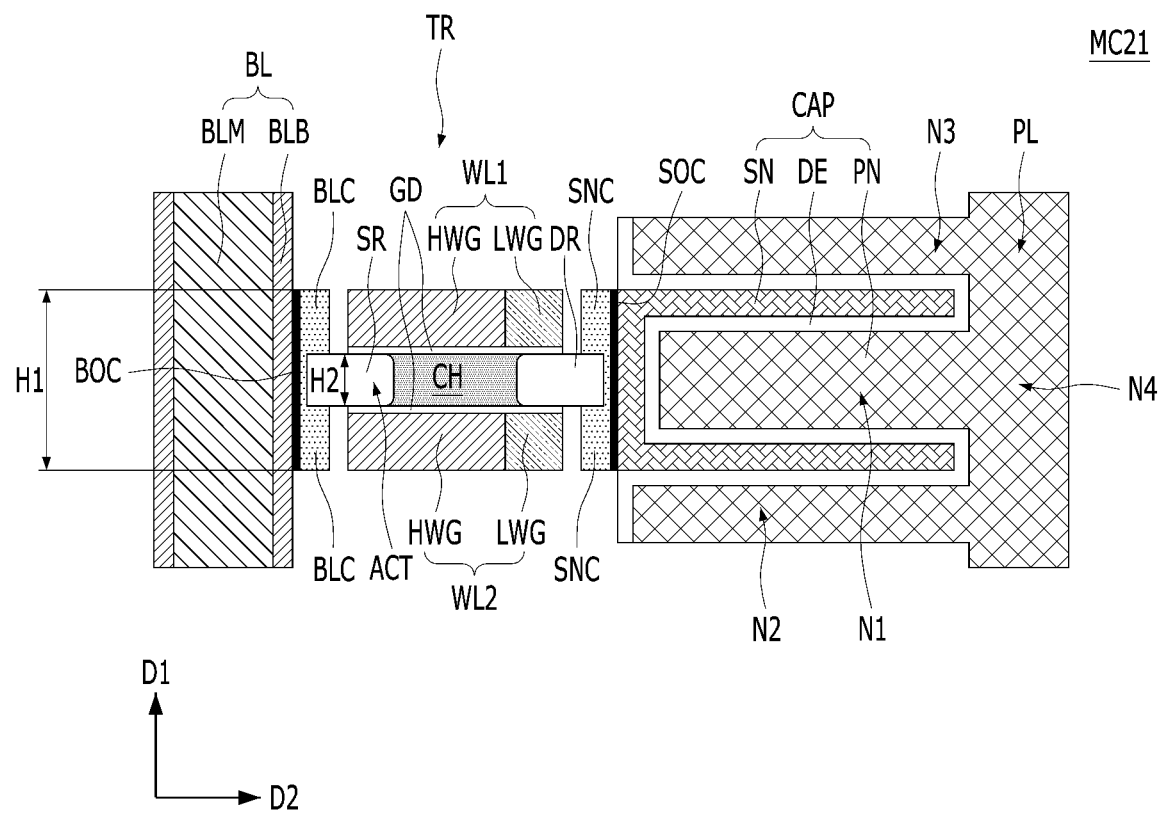

FIGS. 14A and 14B are cross-sectional views of memory cells according to other embodiments of the present invention. In FIGS. 14A and 14B, detailed descriptions of duplicate components with those of FIGS. 1 to 9 may be omitted.

Referring to FIGS. 14A and 14B, the memory cells MC20 and MC21 may include a bit line BL, a transistor TR including a double word line, and a capacitor CAP. The double word line may form a pair of the first word line WL1 and the second word line WL2 with the active layer ACT interposed therebetween. Each of the memory cells MC20 and MC21 may include a bit line contact node BLC, a bit line side-ohmic contact BOC, a storage contact node SOC, and a storage node side-ohmic contact SOC. In the memory cell MC20 of FIG. 14A, the bit line contact node BLC and the storage contact node SNC may each have a double structure. In the memory cell MC21 of FIG. 14B, the bit line contact node BLC and the storage contact node SNC may each have a single structure.

The first and second word lines WL1 and WL2 each may include a low work function electrode LWG and a high work function electrode HWG. The low work function electrode LWG and the high work function electrode HWG may be laterally disposed along the second direction D2. The low work function electrode LWG may be adjacent to the second source/drain region DR, and the high work function electrode HWG may be adjacent to the first source/drain region SR. The low work function electrode LWG and the high work function electrode HWG are formed of different work function materials. The high work function electrode HWG would have a higher work function than the low work function electrode LWG. The high work function electrode HWG includes a high work function material. In one embodiment, the high work function electrode HWG may have higher work function than the mid-gap work function of silicon. The low work function electrode LWG is a material having work function lower than the mid-gap work function of silicon. In other words, the high work function material may have work function higher than 4.5 eV, and the low work function material may have work function lower than 4.5 eV. The low work function electrode LWG may include polysilicon doped with an N-type dopant. The high work function electrode HWG may include a metal-based material. The high work function electrode HWG may include tungsten, titanium nitride, or a combination thereof. A barrier material may be further formed between the low work function electrode LWG and the high work function electrode HWG.

The low work function electrode LWG may be adjacent to the capacitor CAP. The low work function electrode LWG may be disposed between the storage contact node SNC and the high work function electrode HWG. The high work function electrode HWG may be adjacent to the bit line BL. The high work function electrode HWG may be disposed between the bit line contact node BLC and the low work function electrode LWG. The high work function electrode HWG and the low work function electrode LWG may contact each other and may (when viewed along the orientation of FIG. 14A) be positioned at the same level.

As described above, the gate drain induced leakage (GIDL) may be suppressed by forming the low work function electrode LWG.

Figure 15:
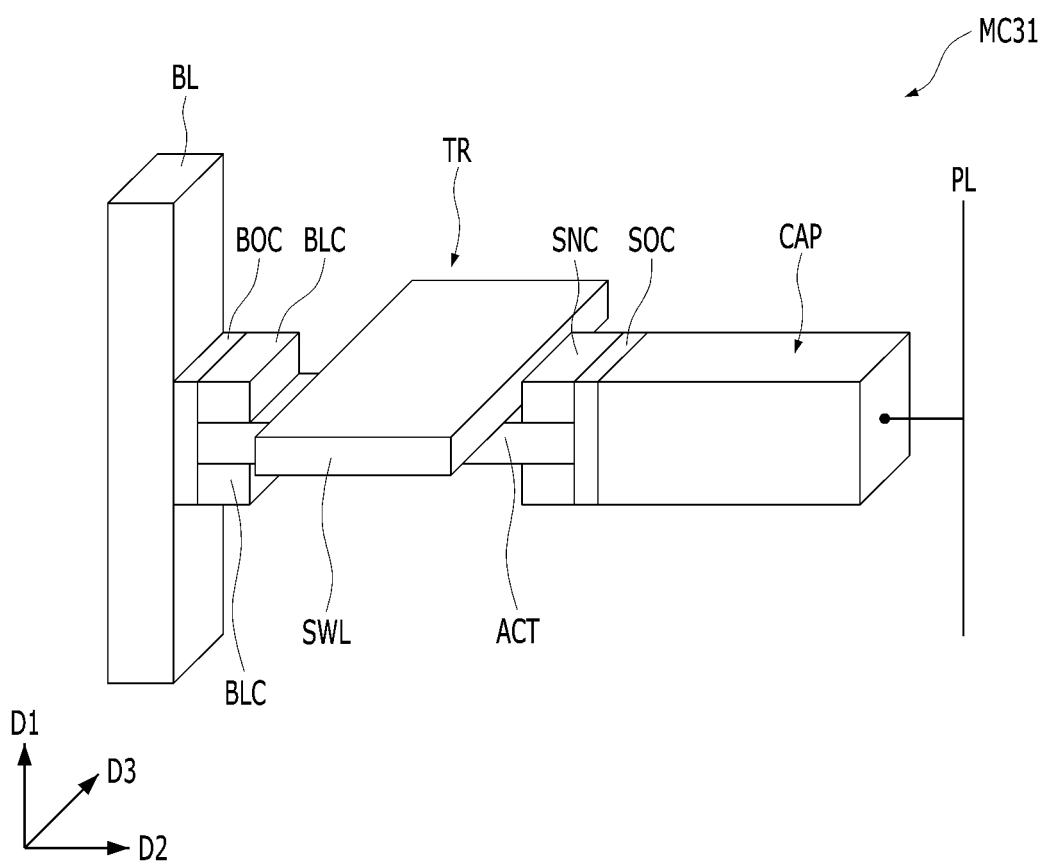
FIG. 15 is a schematic perspective view illustrating a memory cell according to another embodiment of the present invention.

FIG. 15 is a schematic perspective view of a memory cell according to another embodiment of the present invention.

Referring to FIG. 15, the memory cell MC31 of the 3D semiconductor memory device may include a bit line BL, a transistor TR, and a capacitor CAP. The transistor TR may include an active layer ACT, a gate dielectric layer GD, and a single word line SWL. The active layer ACT may include a first source/drain region SR, a second source/drain region DR, and a channel CH between the first source/drain region SR and the second source/drain region DR. The capacitor CAP may include a storage node SN, a dielectric layer DE, and a plate node PN. The bit line BL may have a pillar shape extending in the first direction D1. The active layer ACT may have a bar shape extending in the second direction D2 intersecting the first direction D1. The single word line SWL may have a line shape extending in the third direction D3 intersecting the first direction D1 and the second direction D2. The plate node PN of the capacitor CAP may be connected to the plate line PL.

A bit line side-ohmic contact BOC may be formed between the first source/drain region SR and the bit line BL. The bit line side-ohmic contact BOC and the first source/drain region SR may be commonly connected to bit line contact nodes BLC. The bit line contact nodes BLC may be respectively connected to an upper surface and a lower surface of the first source/drain region SR. The bit line contact nodes BLC may have a double structure such that the bit line contact nodes BLC are disposed on an upper surface and a lower surface of the first source/drain region SR, respectively. The bit line side-ohmic contact BOC may be disposed between the bit line contact nodes BLC and the bit line BL. The height H1 of the bit line side-ohmic contact BOC may be increased by the bit-line contact node BLC. A contact area between the bit line BL and the bit line side-ohmic contact BOC may be increased. A contact area between the bit line BL and the first source/drain region SR may also be increased.

The bit line contact node BLC may include polysilicon, for example, polysilicon doped with an N-type impurity. The height of the bit line side-ohmic contact BOC, that is, the thickness H1 of the bit-line side-ohmic contact BOC in the first direction D1, may be greater than the thickness H2 of the active layer ACT in the first direction D1. The bit line side-ohmic contact BOC may have a height that fully covers side surfaces of the bit line contact nodes BLC and the first source/drain region SR.

The bit line side-ohmic contact BOC may be formed when the silicon of the bit line contact nodes BLC and the first source/drain region SR react with the metal of the bit line BL. The bit line side-ohmic contact BOC may include metal silicide.

A storage node side-ohmic contact SOC may be formed between the second source/drain region DR and the storage node SN. The storage node side-ohmic contact SOC and the second source/drain region DR may be commonly connected to the storage contact nodes SNC. The storage contact nodes SNC may be connected to an upper surface and a lower surface of the second source/drain region DR, respectively. The storage contact nodes SNC may have a double structure such that the storage contact nodes SNC are disposed on an upper surface and a lower surface of the second source/drain region DR, respectively. The storage node side-ohmic contact SOC may be disposed between the storage contact nodes SNC and the storage node SN. The height H1 of the storage node side-ohmic contact SOC may be increased by the storage contact node SNC, thereby increasing a contact area between the storage node SN and the storage node side-ohmic contact SOC. A contact area between the storage node SN and the second source/drain region DR may be increased.

The storage node side-ohmic contact SOC and the bit line side-ohmic contact BOC may have the same height. The storage contact nodes SNC may include polysilicon, for example, polysilicon doped with an N-type impurity. The height of the storage node side-ohmic contact SOC, that is, the thickness H1 of the storage node side-ohmic contact SOC in the first direction D1, may be greater than the thickness H2 of the active layer ACT. The second source/drain region DR may be doped with N-type impurities diffused from the storage contact nodes SNC. The storage node side-ohmic contact SOC may have a height that fully covers side surfaces of the storage contact nodes SNC and the second source/drain region DR.

The storage node side-ohmic contact SOC may be formed when the silicon of the storage contact node SNC and the second source/drain region DR react with a metal. The storage node side-ohmic contact SOC may include metal silicide.

In another embodiment of the present invention, the storage node side-ohmic contact SOC and the storage contact nodes SNC may be omitted as shown in FIG. 1.

In another embodiment of the present invention, each of the bit line contact nodes BLC and the storage contact nodes SNC may have a single structure as shown in FIG. 12.

In another embodiment of the present invention, the single word line SWL may include a low work function electrode and a high work function electrode as shown in FIG. 14A.

In another embodiment of the present invention, the memory cell MC31 may constitute a memory cell array as shown in FIG. 3.

Figure 16:
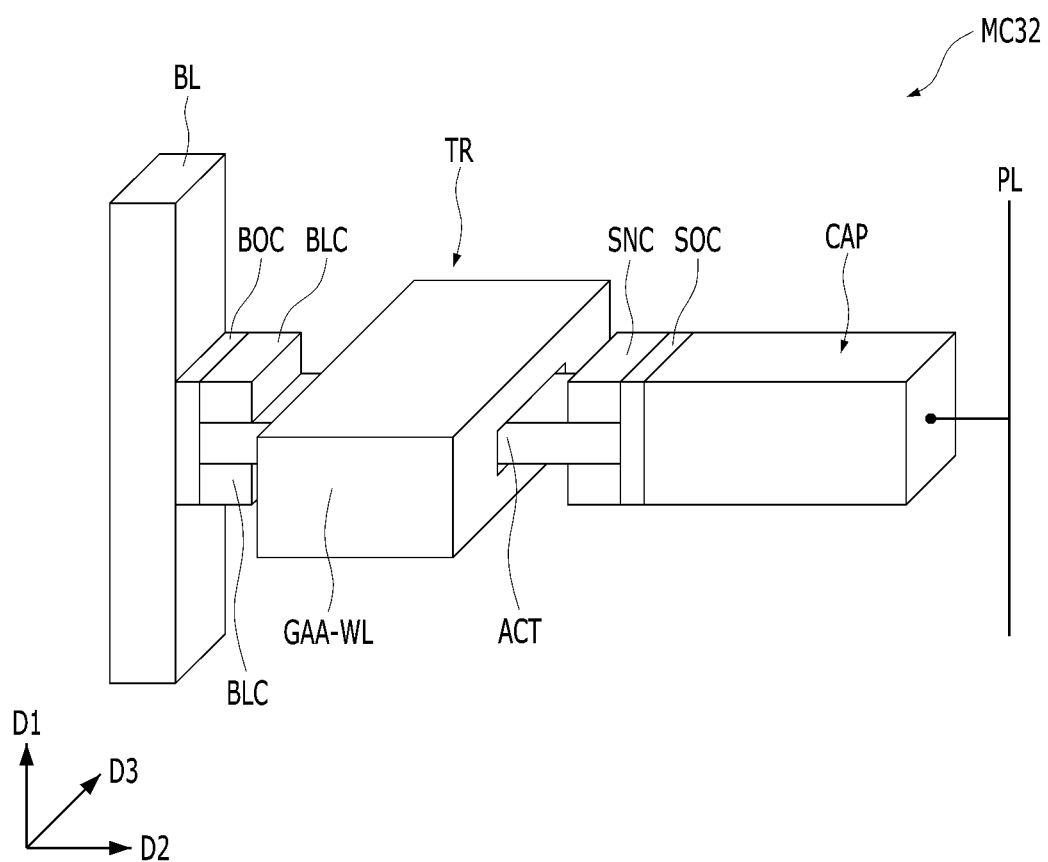
FIG. 16 is a schematic perspective view illustrating a memory cell according to another embodiment of the present invention.

FIG. 16 is a schematic perspective view illustrating a memory cell according to another embodiment of the present invention.

Referring to FIG. 16, the memory cell MC32 of the 3D semiconductor memory device may include a bit line BL, a transistor TR, and a capacitor CAP. The transistor TR may include an active layer ACT, a gate dielectric layer GD, and a gate all-around word line GAA-WL. The active layer ACT may include a first source/drain region SR, a second source/drain region DR, and a channel CH between the first source/drain region SR and the second source/drain region DR. The capacitor CAP may include a storage node SN, a dielectric layer DE, and a plate node PN. The bit line BL may have a pillar shape extending in the first direction D1. The active layer ACT may have a bar shape extending in the second direction D2 intersecting the first direction D1. The gate all-around word line GAA-WL may have a line shape extending in the third direction D3 intersecting the first direction D1 and the second direction D2. The plate node PN of the capacitor CAP may be connected to the plate line PL. The gate all-around word line GAA-WL may surround the active layer ACT.

A bit line side-ohmic contact BOC may be formed between the first source/drain region SR and the bit line BL. The bit line side-ohmic contact BOC and the first source/drain region SR may be commonly connected to the bit line contact nodes BLC. The bit line contact nodes BLC may be respectively connected to an upper surface and a lower surface of the first source/drain region SR. The bit line contact nodes BLC may have a double structure that the bit line contact nodes BLC are disposed on an upper surface and a lower surface of the first source/drain region SR, respectively. The bit line side-ohmic contact BOC may be disposed between the bit line contact nodes BLC and the bit line BL. The height H1 of the bit line side-ohmic contact BOC may be increased by the bit-line contact nodes BLC. A contact area between the bit line BL and the bit line side-ohmic contact BOC may be increased. A contact area between the bit line BL and the first source/drain region SR may also be increased.

The bit line contact nodes BLC may include polysilicon, for example, polysilicon doped with an N-type impurity. The height of the bit line side-ohmic contact BOC, that is, the thickness H1 of the bit-line side-ohmic contact BOC in the first direction D1, may be greater than the thickness H2 of the active layer ACT in the first direction D1. The bit line side-ohmic contact BOC may have a height that fully covers side surfaces of the bit line contact nodes BLC and the first source/drain region SR.

The bit line side-ohmic contact BOC may be formed when the silicon of the bit line contact node BLC and the first source/drain region SR react with the metal of the bit line BL. The bit line side-ohmic contact BOC may include metal silicide.

A storage node side-ohmic contact SOC may be formed between the second source/drain region DR and the storage node SN. The storage node side-ohmic contact SOC and the second source/drain region DR may be commonly connected to the storage contact nodes SNC. The storage contact nodes SNC may be respectively connected to an upper surface and a lower surface of the second source/drain region DR. The storage contact nodes SNC may have a double structure that the storage contact nodes SNC are disposed on an upper surface and a lower surface of the second source/drain region DR, respectively. The storage node side-ohmic contact SOC may be disposed between the storage contact nodes SNC and the storage node SN. The height H1 of the storage node side-ohmic contact SOC may be increased by the storage contact node SNC, thereby increasing a contact area between the storage node SN and the storage node side-ohmic contact SOC. A contact area between the storage node SN and the second source/drain region DR may be increased.

The storage node side-ohmic contact SOC and the bit line side-ohmic contact BOC may have the same height. The storage contact nodes SNC may include polysilicon, for example, polysilicon doped with an N-type impurity. The height of the storage node side-ohmic contact SOC, that is, the thickness H1 of the storage node side-ohmic contact SOC in the first direction D1, may be greater than the thickness H2 of the active layer ACT in the first direction D1. The second source/drain region DR may be doped with N-type impurities diffused from the storage contact nodes SNC. The storage node side-ohmic contact SOC may have a height that fully covers side surfaces of the storage contact nodes SNC and the second source/drain region DR.

The storage node side-ohmic contact SOC may be formed when the silicon of the storage contact nodes SNC and the second source/drain region DR react with a metal. The storage node side-ohmic contact SOC may include metal silicide.

In another embodiment of the present invention, the storage node side-ohmic contact SOC and the storage contact nodes SNC may be omitted as shown in FIG. 1.

In another embodiment of the present invention, each of the bit line contact nodes BLC and the storage contact nodes SNC may have a single structure as shown in FIG. 12.

In another embodiment of the present invention, the gate all-around word lines GAA-WL may include a low work function electrode and a high work function electrode as shown in FIG. 14A.

In another embodiment of the present invention, the memory cell MC32 of FIG. 16 may constitute a memory cell array as shown in FIG. 3.

The present invention described above is not limited by the above-described embodiments and the accompanying drawings, and it will be apparent to those skilled in the art that various changes and modifications may be made without departing from the spirit and scope of the present invention disclosure as defined in the following claims.

What is claimed is:

1. A semiconductor memory device, comprising:
a transistor laterally extending in a direction parallel to a substrate and including an active layer over the substrate, the active layer having a first end and a second end;
bit line contact nodes formed on an upper surface and a lower surface of the first end of the active layer, respectively;
a bit line side-ohmic contact vertically extending and connecting to the first end of the active layer and the bit line contact nodes;
a bit line extending in a vertical direction to the substrate and connected to the bit line side-ohmic contact;
a capacitor connected to the second end of the active layer,
wherein the bit line side-ohmic contact includes a metal silicide, and
wherein the bit line contact nodes include doped polysilicon.

2. The semiconductor memory device of claim 1, wherein the active layer includes monocrystalline silicon, polysilicon, germanium, silicon-germanium, or IGZO (Indium Gallium Zinc Oxide).

3. The semiconductor memory device of claim 1, wherein the bit line contact nodes cover upper, lower, and side surfaces of the first end of the active layer.

4. The semiconductor memory device of claim 1, further including a word line extending in a direction intersecting the active layer over the active layer,
wherein the active layer includes a thin-body channel, the thin-body channel being thinner than the word line.

5. The semiconductor memory device of claim 4, wherein the word line includes at least one of a double word line, a single word line, or a gate-all-around word line.

6. The semiconductor memory device of claim 1, wherein the active layer includes:
a channel;
a first source/drain region disposed on one side of the channel, and connected to the bit line side-ohmic contact and the bit line contact nodes; and
a second source/drain region disposed on another side of the channel, and connected to the capacitor.

7. The semiconductor memory device of claim 6, wherein the bit line side-ohmic contact has a height that fully covers side surfaces of the bit line contact nodes and the first source/drain region.

8. A semiconductor memory device, comprising:
a transistor laterally extending in a direction parallel to a substrate and including an active layer over the substrate, the active layer having a first end and a second end;
bit line contact nodes formed on an upper surface and a lower surface of the first end of the active layer, respectively;
a bit line side-ohmic contact vertically extending and connecting to the first end of the active layer and the bit line contact nodes;
a bit line extending in a vertical direction to the substrate and connected to the bit line side-ohmic contact;
storage contact nodes formed on an upper surface and a lower surface of the second end of the active layer, respectively;
a storage node side-ohmic contact vertically extending and connecting to the second end of the active layer and the storage contact nodes; and
a capacitor connected to the storage node side-ohmic contact,
wherein the bit line side-ohmic contact and the storage node side-ohmic contact include a metal silicide, and
wherein each of the bit line contact nodes and the storage contact nodes includes doped polysilicon.

9. The semiconductor memory device of claim 8, wherein the active layer includes:
a channel;
a first source/drain region disposed on one side of the channel and connected to the bit line side-ohmic contact and the bit line contact nodes; and
a second source/drain region disposed on another side of the channel and connected to the storage node side-ohmic contact and the storage contact nodes.

10. The semiconductor memory device of claim 8, wherein the bit line side-ohmic contact has a height that fully covers side surfaces of the bit line contact nodes and the first source/drain region.

11. The semiconductor memory device of claim 8, wherein the storage node side-ohmic contact has a height that fully covers side surfaces of the storage contact nodes and the second source/drain region.

12. The semiconductor memory device of claim 8, wherein the active layer includes monocrystalline silicon, polysilicon, germanium, silicon-germanium, or IGZO (Indium Gallium Zinc Oxide).

13. The semiconductor memory device of claim 8, wherein the capacitor includes a cylindrical storage node, the cylindrical storage node being connected to the storage node side-ohmic contact.

14. The semiconductor memory device of claim 8,
wherein the bit line contact nodes cover upper, lower, and side surfaces of the first end of the active layer, and
wherein the storage contact nodes cover upper, lower, and side surfaces of the second end of the active layer.

15. The semiconductor memory device of claim 8, further including a word line extending in a direction which crosses the active layer.

16. The semiconductor memory device of claim 15, wherein the word line includes at least one of a double word line, a single word line, or a gate-all-around word line.

17. The semiconductor memory device of claim 8, wherein the word line includes:
a high work function electrode adjacent to the bit line; and
a low work function electrode having a lower work function than the high work function electrode and located adjacent to the capacitor.

18. The semiconductor memory device of claim 17,
wherein the high work function electrode includes a metal-based material, and
wherein the low work function electrode includes polysilicon doped with an N-type impurity.

19. A method for fabricating a semiconductor memory device, the method comprising:
forming a stack body laterally oriented and including an active layer, the active layer including a first end and a second end;
forming first contact nodes on upper and lower surfaces of the first end of the active layer, respectively;
forming a first ohmic contact being vertically oriented to cover the first contact nodes and the first end of the active layer; and
forming a first conductive layer connected to the first ohmic contact and vertically oriented in a direction crossing the active layer,
wherein the first contact nodes include polysilicon, and the first ohmic contact includes metal silicide.

20. The method of claim 19, wherein the first contact nodes include a double structure such that the first contact nodes are disposed on upper and lower surfaces of the first end of the active layer, respectively.

21. The method of claim 19, wherein the first contact nodes cover upper, lower, and side surfaces of the first end of the active layer.

22. The method of claim 19, wherein the first conductive layer includes a bit line.

23. The method of claim 19, after the forming of the first conductive layer, further including:
forming second contact nodes on upper and lower surfaces of the second end of the active layer, respectively;
forming a second ohmic contact vertically oriented to cover the second contact nodes and the second end of the active layer; and
forming a second conductive layer connected to the second ohmic contact.

24. The method of claim 23, wherein the second contact nodes include a double structure such that the second contact nodes are disposed on upper and lower surfaces of the second end of the active layer, respectively.

25. The method of claim 23, wherein the second contact nodes cover upper, lower, and side surfaces of the second end of the active layer.

26. The method of claim 23, wherein the second contact nodes include polysilicon, and the second ohmic contact includes metal silicide.

27. The method of claim 23, wherein the second conductive layer includes a storage node of a capacitor.

28. The method of claim 19, before the forming of the first contact nodes, further including forming conductive lines facing each other with the active layer interposed therebetween.

29. The method of claim 28, wherein each of the conductive lines includes:
a high work function electrode adjacent to the first end of the active layer; and
a low work function electrode having a lower work function than the high work function electrode and adjacent to the capacitor.

* * * * *